(12) United States Patent
Wu

(10) Patent No.: US 11,802,891 B1
(45) Date of Patent: Oct. 31, 2023

(54) COMPLIANT PIN PROBES WITH MULTIPLE SPRING SEGMENTS AND COMPRESSION SPRING DEFLECTION STABILIZATION STRUCTURES, METHODS FOR MAKING, AND METHODS FOR USING

(71) Applicant: Microfabrica Inc., Van Nuys, CA (US)

(72) Inventor: Ming Ting Wu, San Jose, CA (US)

(73) Assignee: Microfabrica Inc., Van Nuys (CA)

( * ) Notice: Subject to any disclaimer, the term of this patent is extended or adjusted under 35 U.S.C. 154(b) by 125 days.

(21) Appl. No.: 17/139,933

(22) Filed: Dec. 31, 2020

Related U.S. Application Data

(60) Provisional application No. 62/961,678, filed on Jan. 15, 2020, provisional application No. 62/961,672, filed on Jan. 15, 2020, provisional application No. 62/961,675, filed on Jan. 15, 2020, provisional application No. 62/956,016, filed on Dec. 31, 2019, provisional application No. 62/956,124, filed on Dec. 31, 2019, provisional application No. 62/956,122, filed on Dec. 31, 2019.

(51) Int. Cl.
*G01R 1/067* (2006.01)
(52) U.S. Cl.
CPC ................. *G01R 1/06722* (2013.01)
(58) Field of Classification Search
CPC .................................................. G01R 1/06722
See application file for complete search history.

(56) References Cited

U.S. PATENT DOCUMENTS

| | | | |
|---|---|---|---|
| 4,027,935 A | 6/1977 | Byrnes et al. | |
| 4,116,523 A | 9/1978 | Coberly et al. | |
| 4,737,114 A | 4/1988 | Yaegashi | |
| 4,773,877 A | 9/1988 | Kruger et al. | |
| 4,821,411 A | 4/1989 | Yaegashi | |
| 4,952,272 A | 8/1990 | Okino et al. | |
| 5,177,438 A | 1/1993 | Littlebury et al. | |
| 5,190,637 A | 3/1993 | Guckel | |
| 5,286,208 A | 2/1994 | Matsuoka | |

(Continued)

FOREIGN PATENT DOCUMENTS

| JP | 4014040 A2 | 1/1992 |
|---|---|---|
| JP | 2734412 B2 | 3/1998 |

(Continued)

OTHER PUBLICATIONS

Cohen, et al., "EFAB: Batch Production of Functional, Fully-Dense Metal Parts with Micron-Scale Features", Proc. 9th Solid Freeform Fabrication, The University of Texas at Austin, Aug. 1998, pp. 161-168.

(Continued)

*Primary Examiner* — Paresh Patel
(74) *Attorney, Agent, or Firm* — Holland & Hart LLP

(57) ABSTRACT

Embodiments are directed to probe structures, arrays, methods of using probes and arrays, and/or methods for making probes and/or arrays. In the various embodiments, probes include at least two flat spring segments with at least one of those segments being used in a compressive manner wherein the probe additionally includes guide elements, framing structures or other structural configurations that limit or inhibit one or more compressive spring segments from bowing or deflecting out of a desired position when subjected to loading.

13 Claims, 17 Drawing Sheets

(56) References Cited

U.S. PATENT DOCUMENTS

| | | |
|---|---|---|
| 5,321,685 A | 6/1994 | Nose et al. |
| 5,476,211 A | 12/1995 | Khandros |
| 5,513,430 A | 5/1996 | Yanof et al. |
| 5,599,194 A | 2/1997 | Ozawa et al. |
| 5,605,614 A | 2/1997 | Bornand |
| 5,811,982 A | 9/1998 | Beaman et al. |
| 5,865,641 A | 2/1999 | Swart et al. |
| 5,892,223 A | 4/1999 | Karpov et al. |
| 5,917,707 A | 6/1999 | Khandros et al. |
| 5,952,843 A | 9/1999 | Vinh |
| 5,994,152 A | 11/1999 | Khandros et al. |
| 6,027,630 A | 2/2000 | Cohen |
| 6,043,563 A | 3/2000 | Eldridge et al. |
| 6,184,053 B1 | 2/2001 | Eldridge et al. |
| 6,208,155 B1 | 3/2001 | Barabi et al. |
| 6,218,203 B1 | 4/2001 | Khoury et al. |
| 6,250,933 B1 | 6/2001 | Khoury et al. |
| 6,255,126 B1 | 7/2001 | Mathieu et al. |
| 6,264,477 B1 | 7/2001 | Smith et al. |
| 6,268,015 B1 | 7/2001 | Mathieu et al. |
| 6,299,458 B1 | 10/2001 | Yamagami et al. |
| 6,329,827 B1 | 12/2001 | Beaman et al. |
| 6,336,269 B1 | 1/2002 | Eldridge et al. |
| 6,358,097 B1 | 3/2002 | Peters |
| 6,414,501 B2 | 7/2002 | Kim et al. |
| 6,426,638 B1 | 7/2002 | Di Stefano |
| 6,482,013 B2 | 11/2002 | Eldridge et al. |
| 6,491,968 B1 | 12/2002 | Mathieu et al. |
| 6,507,207 B2 | 1/2003 | Nguyen |
| 6,520,778 B1 | 2/2003 | Eldridge et al. |
| 6,560,861 B2 | 5/2003 | Fork et al. |
| 6,573,738 B1 | 6/2003 | Matsuo et al. |
| 6,624,645 B2 | 9/2003 | Haseyama et al. |
| 6,626,708 B2 | 9/2003 | Phillips |
| 6,651,325 B2 | 11/2003 | Lee et al. |
| 6,672,876 B1 | 1/2004 | Takekoshi |
| 6,690,185 B1 | 2/2004 | Khandros et al. |
| 6,720,781 B2 | 4/2004 | Ott et al. |
| 6,758,682 B1 | 7/2004 | Kosmala |
| 6,771,084 B2 | 8/2004 | Di Stefano |
| 6,777,319 B2 | 8/2004 | Grube et al. |
| 6,783,405 B1 | 8/2004 | Yen |
| 6,784,378 B2 | 8/2004 | Zhu et al. |
| 6,787,456 B1 | 9/2004 | Kripesh et al. |
| 6,807,734 B2 | 10/2004 | Eldridge et al. |
| 6,811,406 B2 | 11/2004 | Grube |
| 6,844,748 B2 | 1/2005 | Sato et al. |
| 6,855,010 B1 | 2/2005 | Yen |
| D507,198 S | 7/2005 | Kister |
| 6,935,901 B2 | 8/2005 | Simpson et al. |
| 6,967,492 B2 | 11/2005 | Tsui et al. |
| 6,998,857 B2 | 2/2006 | Terada et al. |
| 7,047,638 B2 | 5/2006 | Eldridge et al. |
| 7,063,541 B2 | 6/2006 | Grube et al. |
| 7,091,729 B2 | 8/2006 | Kister |
| 7,098,540 B1 | 8/2006 | Mohan et al. |
| 7,109,118 B2 | 9/2006 | Cohen et al. |
| 7,126,220 B2 | 10/2006 | Lahiri et al. |
| 7,131,848 B2 | 11/2006 | Lindsey et al. |
| 7,148,709 B2 | 12/2006 | Kister |
| 7,172,431 B2 | 2/2007 | Beaman et al. |
| 7,198,704 B2 | 4/2007 | Cohen et al. |
| 7,220,134 B2 | 5/2007 | Goodman et al. |
| 7,229,542 B2 | 6/2007 | Bang |
| 7,235,166 B2 | 6/2007 | Cohen et al. |
| 7,239,219 B2 | 7/2007 | Brown et al. |
| 7,256,593 B2 | 8/2007 | Treibergs |
| 7,273,812 B2 | 9/2007 | Kim et al. |
| 7,279,917 B2 | 10/2007 | Williams et al. |
| 7,288,178 B2 | 10/2007 | Cohen et al. |
| 7,291,564 B1 | 11/2007 | Jackson |
| 7,326,327 B2 | 2/2008 | Armstrong et al. |
| 7,368,044 B2 | 5/2008 | Cohen et al. |
| 7,412,767 B2 | 8/2008 | Kim et al. |
| 7,435,102 B2 | 10/2008 | Goodman |
| 7,436,192 B2 | 10/2008 | Kister |
| 7,437,813 B2 | 10/2008 | Tunaboylu et al. |
| 7,446,548 B2 | 11/2008 | Chen |
| 7,449,910 B2 | 11/2008 | Kirby et al. |
| 7,456,642 B2 | 11/2008 | Saulnier et al. |
| 7,462,800 B2 | 12/2008 | Tunaboylu et al. |
| 7,498,714 B2 | 3/2009 | Lockard et al. |
| 7,501,328 B2 | 3/2009 | Lockard et al. |
| 7,504,839 B2 | 3/2009 | Feigenbaum et al. |
| 7,504,840 B2 | 3/2009 | Arat et al. |
| 7,527,721 B2 | 5/2009 | Lembrikov et al. |
| 7,531,077 B2 | 5/2009 | Cohen et al. |
| 7,533,462 B2 | 5/2009 | Gleason et al. |
| 7,557,595 B2 | 7/2009 | Chen et al. |
| 7,579,856 B2 | 8/2009 | Khandros et al. |
| 7,583,098 B2 | 9/2009 | Tunaboylu et al. |
| 7,628,620 B2 | 12/2009 | Gritters |
| 7,629,807 B2 | 12/2009 | Hirakawa et al. |
| 7,637,007 B2 | 12/2009 | Tunaboylu et al. |
| 7,638,028 B2 | 12/2009 | Tunaboylu et al. |
| 7,640,651 B2 | 1/2010 | Cohen et al. |
| 7,674,112 B2 | 3/2010 | Gritters et al. |
| 7,690,925 B2 | 4/2010 | Goodman |
| 7,721,430 B2 | 5/2010 | Chartarifsky et al. |
| 7,731,546 B2 | 6/2010 | Grube et al. |
| 7,733,101 B2 | 6/2010 | Kister |
| 7,798,822 B2 | 9/2010 | Eldridge et al. |
| 7,808,261 B2 | 10/2010 | Kimoto |
| 7,841,863 B2 | 11/2010 | Mathieu et al. |
| 7,850,460 B2 | 12/2010 | Weiland et al. |
| 7,851,794 B2 | 12/2010 | Hobbs |
| 7,888,958 B2 | 2/2011 | Souma et al. |
| 7,922,544 B2 | 4/2011 | Chung |
| 7,928,751 B2 | 4/2011 | Hsu |
| 7,956,288 B2 | 6/2011 | Kazama et al. |
| 8,012,331 B2 | 9/2011 | Lee et al. |
| 8,070,931 B1 | 12/2011 | Cohen et al. |
| 8,111,080 B2 | 2/2012 | Kister |
| 8,299,394 B2 | 10/2012 | Theppakuttai et al. |
| 8,415,963 B2 | 4/2013 | Kister |
| 8,427,186 B2 | 4/2013 | McFarland |
| 8,451,017 B2 | 5/2013 | Gleason et al. |
| 8,613,846 B2 | 12/2013 | Wu et al. |
| 8,717,054 B2 | 5/2014 | Chen et al. |
| 8,717,055 B2 | 5/2014 | Chen et al. |
| 8,723,543 B2 | 5/2014 | Chen et al. |
| 8,729,916 B2 | 5/2014 | Chen et al. |
| 8,742,272 B2 | 6/2014 | English et al. |
| 8,926,379 B2 | 1/2015 | Vinther |
| 9,030,222 B2 | 5/2015 | Eldridge et al. |
| 9,052,342 B2 | 6/2015 | Fan et al. |
| 9,097,740 B2 | 8/2015 | Kister |
| 9,121,868 B2 | 9/2015 | Kister |
| 9,244,101 B2 | 1/2016 | Cohen et al. |
| 9,316,670 B2 | 4/2016 | Kister |
| 9,476,911 B2 | 10/2016 | Kister |
| RE46,221 E | 11/2016 | Kister |
| 9,540,233 B2 | 1/2017 | Kumar et al. |
| 9,671,429 B2 | 6/2017 | Wu et al. |
| 9,702,904 B2 | 7/2017 | Breinlinger et al. |
| 9,878,401 B1 | 1/2018 | Veeramani et al. |
| 9,972,933 B2 | 5/2018 | Kimura et al. |
| 10,215,775 B2 | 2/2019 | Wu et al. |
| 10,416,192 B2 | 9/2019 | Chen et al. |
| 10,641,792 B2 | 5/2020 | Wu et al. |
| 10,788,512 B2 | 9/2020 | Chen et al. |
| 10,877,067 B2 | 12/2020 | Chen et al. |
| 11,131,690 B2 | 9/2021 | Crippa |
| 2002/0196038 A1 | 12/2002 | Okuno et al. |
| 2003/0001606 A1 | 1/2003 | Bende et al. |
| 2003/0221968 A1 | 12/2003 | Cohen et al. |
| 2004/0000489 A1 | 1/2004 | Zhang et al. |
| 2004/0004001 A1 | 1/2004 | Cohen et al. |
| 2004/0051541 A1 | 3/2004 | Zhou et al. |
| 2004/0065550 A1 | 4/2004 | Zhang |
| 2004/0065555 A1 | 4/2004 | Zhang |
| 2004/0134772 A1 | 7/2004 | Cohen et al. |
| 2004/0146650 A1 | 7/2004 | Lockard et al. |
| 2005/0029109 A1 | 2/2005 | Zhang et al. |

(56) References Cited

U.S. PATENT DOCUMENTS

| | | |
|---|---|---|
| 2005/0032375 A1 | 2/2005 | Lockard et al. |
| 2005/0067292 A1 | 3/2005 | Thompson et al. |
| 2005/0070170 A1 | 3/2005 | Zhang et al. |
| 2005/0072681 A1 | 4/2005 | Cohen et al. |
| 2005/0104609 A1 | 5/2005 | Arat et al. |
| 2005/0176285 A1 | 8/2005 | Chen et al. |
| 2005/0179458 A1 | 8/2005 | Chen et al. |
| 2005/0184748 A1 | 8/2005 | Chen et al. |
| 2005/0189958 A1 | 9/2005 | Chen et al. |
| 2005/0202667 A1 | 9/2005 | Cohen et al. |
| 2005/0230261 A1 | 10/2005 | Cohen et al. |
| 2005/0253606 A1 | 11/2005 | Kim et al. |
| 2006/0006888 A1 | 1/2006 | Kruglick et al. |
| 2006/0051948 A1 | 3/2006 | Kim et al. |
| 2006/0053625 A1 | 3/2006 | Kim et al. |
| 2006/0108678 A1 | 5/2006 | Kumar et al. |
| 2006/0170440 A1 | 8/2006 | Sudin |
| 2006/0226015 A1 | 10/2006 | Smalley et al. |
| 2006/0238209 A1 | 10/2006 | Chen et al. |
| 2007/0144841 A1 | 6/2007 | Chong et al. |
| 2007/0200576 A1 | 8/2007 | Laurent et al. |
| 2008/0108221 A1 | 5/2008 | Kim et al. |
| 2008/0111573 A1 | 5/2008 | Chen et al. |
| 2008/0174332 A1 | 7/2008 | Arat et al. |
| 2009/0066351 A1 | 3/2009 | Arat et al. |
| 2009/0079455 A1 | 3/2009 | Gritters |
| 2010/0088888 A1 | 4/2010 | Mathieu et al. |
| 2010/0134131 A1 | 6/2010 | Chen et al. |
| 2010/0155253 A1 | 6/2010 | Kim et al. |
| 2010/0176834 A1 | 7/2010 | Chen et al. |
| 2011/0147223 A1 | 6/2011 | Kumar et al. |
| 2011/0187397 A1 | 8/2011 | Chen et al. |
| 2011/0187398 A1 | 8/2011 | Chen et al. |
| 2012/0176122 A1 | 7/2012 | Hirata et al. |
| 2014/0231264 A1 | 8/2014 | Chen et al. |
| 2019/0204354 A1 | 7/2019 | Chen et al. |
| 2020/0064373 A1* | 2/2020 | Treibergs ............ G01R 1/06722 |
| 2020/0241042 A1 | 7/2020 | Jeong et al. |

FOREIGN PATENT DOCUMENTS

| | | |
|---|---|---|
| JP | 2001337110 A | 12/2001 |
| JP | 2004156993 A | 6/2004 |
| JP | 2004340617 A | 12/2004 |
| JP | 2004340654 A | 12/2004 |
| JP | 2008032400 A | 2/2008 |
| WO | 07097559 A1 | 8/2007 |

OTHER PUBLICATIONS

Adam L. Cohen, et al., "EFAB: Rapid, Low-Cost Desktop Micromachining of High Aspect Ratio True 3-D MEMS", Proc. 12th IEEE Micro Electro Mechanical Systems Workshop, IEEE, Jan. 17-21, 1999, pp. 244-251.

"Microfabrication—Rapid Prototyping's Killer Application", Rapid Prototyping Report, CAD/CAM Publishing, Inc., Jun. 1999, pp. 1-5.

Adam L. Cohen, "3-D Micromachining by Electrochemical Fabrication", Micromachine Devices, Mar. 1999, pp. 6-7.

Gang Zhang, et al., "EFAB: Rapid Desktop Manufacturing of True 3-D Microstructures", Proc. 2nd International Conference on Integrated MicroNanotechnology for Space Applications, The Aerospace Co., Apr. 1999.

F. Tseng, et al., "EFAB: High Aspect Ratio, Arbitrary 3-D Metal Microstructures Using a Low-Cost Automated Batch Process", 3rd International Workshop on High Aspect Ratio Microstructure Technology (HARMST'99), Jun. 1999.

Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999, pp. 55-60.

Adam L. Cohen, "Electrochemical Fabrication (EFABTM)", Chapter 19 of the MEMS Handbook, edited by Mohamed Gad-El-Hak, CRC Press, 2002, pp. 19/1-19/23.

Hill, Dr. Steve, "An E-FAB Way for Making the Micro World", Materials World is the journal of The Institute of Materials, Sep. 1999, vol. 7, No. 9, pp. 538-539.

Madden, John D. et al., "Three-Dimensional Microfabrication by Localized, Electrochemical Deposition", J. of Micro. Sys., Mar. 1996, 5(1):24-32.

Madou, Mark J., "Fundamentals of Microfabrication—The Science of Miniaturization", 2nd ed., 2001, pp. 402-412.

Marques, et al., "Fabrication of High-Aspect-Ratio Microstructures on Planar and Nonplanar Surfaces Using a Modified LIGA Process", Dec. 1997, 6(4):329-336.

Weeden, Otto, Keithley Instruments, Inc. "Probe Card Tutorial", pp. 1-40, 2003.

* cited by examiner

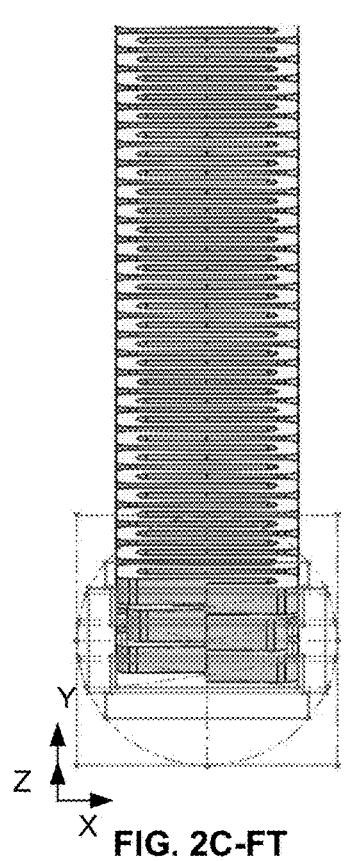
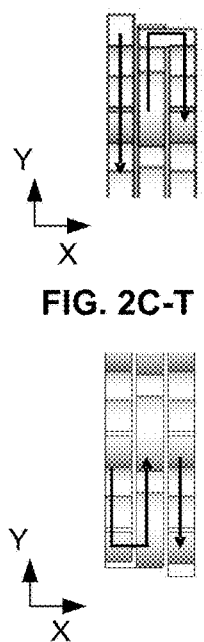
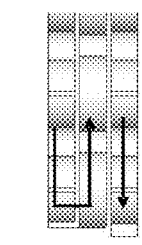
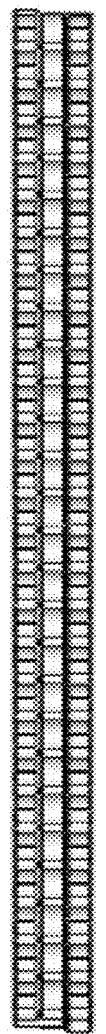
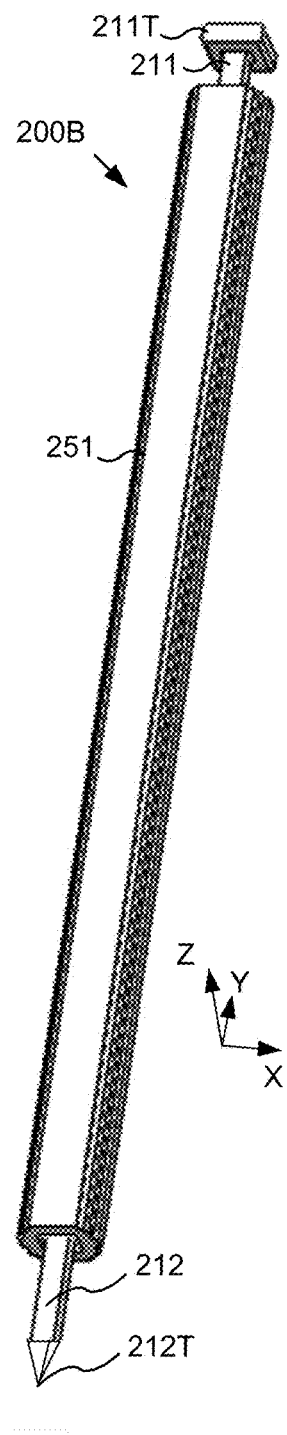
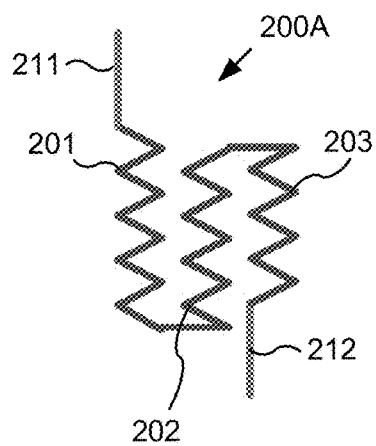
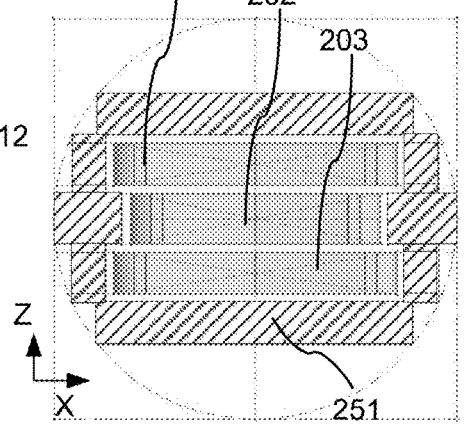
FIG. 2C-T
FIG. 2C-B
FIG. 2C-FT
FIG. 2A
FIG. 2C
FIG. 2D
FIG. 2B

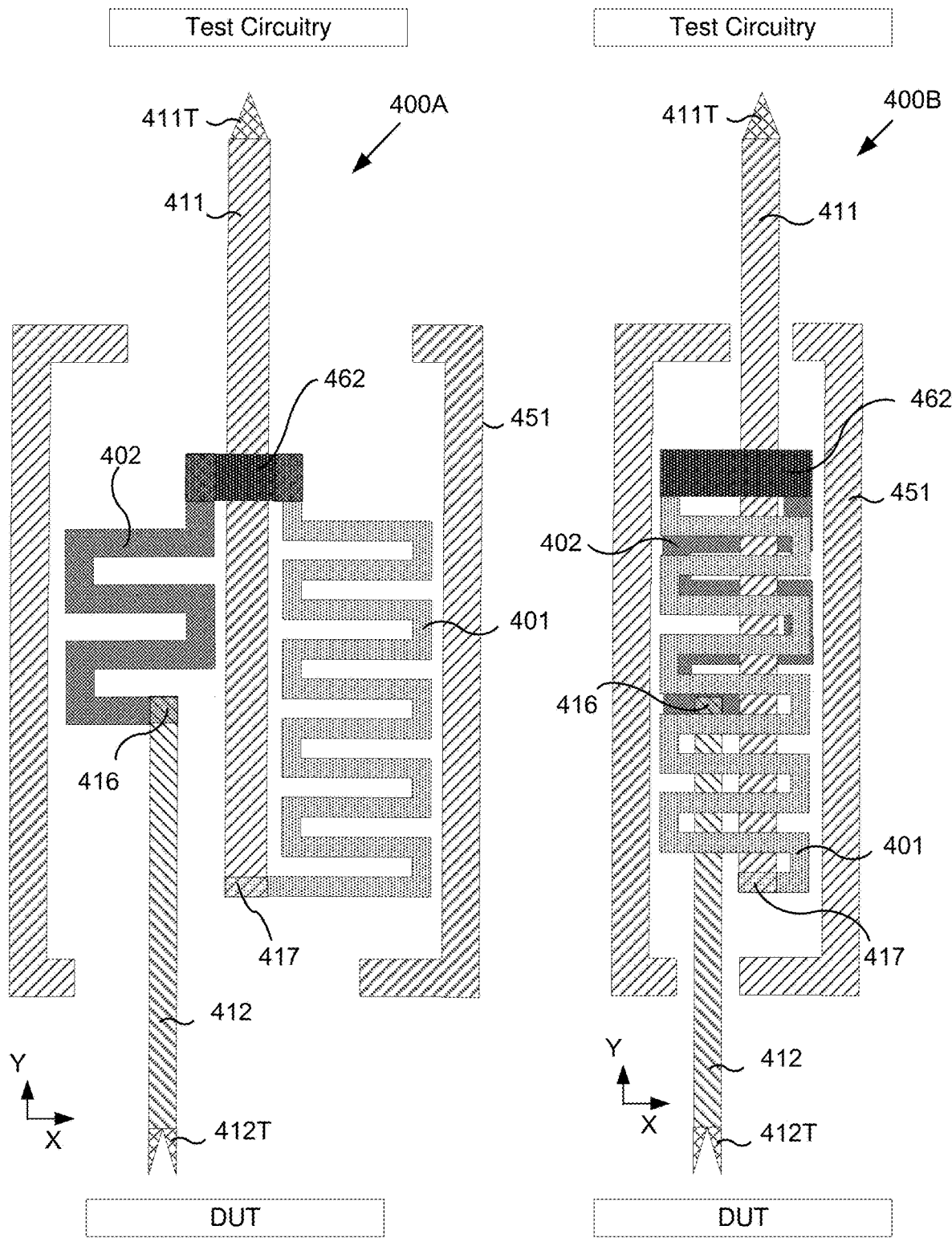

COMPLIANT PIN PROBES WITH MULTIPLE SPRING SEGMENTS AND COMPRESSION SPRING DEFLECTION STABILIZATION STRUCTURES, METHODS FOR MAKING, AND METHODS FOR USING

RELATED APPLICATIONS

The below table sets forth the priority claims for the instant application along with filing dates, patent numbers, and issue dates as appropriate. Each of the listed applications is incorporated herein by reference as if set forth in full herein including any appendices attached thereto.

| App. No. | Continuity Type | App. No. | Which was Filed | Which is now | Which issued on |
|---|---|---|---|---|---|
| This application | claims benefit of | 62/961,672 | 2020 Jan. 15 | pending | — |
| This application | claims benefit of | 62/956,016 | 2019 Dec. 31 | pending | — |
| This application | claims benefit of | 62/956,122 | 2019 Dec. 31 | pending | — |
| This application | claims benefit of | 62/961,678 | 2020 Jan. 15 | pending | — |
| This application | claims benefit of | 62/956,124 | 2019 Dec. 31 | pending | — |
| This application | claims benefit of | 62/961,675 | 2020 Jan. 15 | pending | — |

FIELD OF THE INVENTION

Embodiments of the present invention relate to probes for testing electronic circuits and more particularly to probes with multiple spring segments and structures for stabilizing deflection of compression springs.

BACKGROUND OF THE INVENTION

Probes:

Numerous electrical contact probe and pin configurations have been commercially used or proposed, some of which may qualify as prior art and others of which do not qualify as prior art. Examples of such pins, probes, and methods of making are set forth in the following patent applications, publications of applications, and patents. Each of these applications, publications, and patents is incorporated herein by reference as if set forth in full herein as are any teachings set forth in each of their prior priority applications.

| U.S. patent application No., Filing Date<br>U.S. application Pub. No., Pub. Date<br>U.S. Pat. No., Pub. Date | First Named Inventor, "Title" | Dkt. No. Fragment |
|---|---|---|
| 10/772,943 - Feb. 4, 2004<br>2005-0104609 - May 19, 2005<br>— | Arat, et al., "Electrochemically Fabricated Microprobes" | 097-A |
| 10/949,738 - Sep. 24, 2019<br>2006-0006888 - Jan. 12, 2006<br>— | Kruglick, et al., "Electrochemically Fabricated Microprobes" | 119-A |
| 11/028,945 - Jan. 3, 2005<br>2005-0223543 - Oct. 13, 2005<br>7,640,651 - Jan. 5, 2010 | Cohen, et al., "A Fabrication Process for Co-Fabricating a Multilayer Probe Array and a Space Transformer" | 134-A |
| 11/028,960 - Jan 3, 2005<br>2005-0179458 - Aug. 18, 2005<br>7,265,565 - Sep. 4, 2007 | Chen, et al. "Cantilever Microprobes for Contacting Electronic Components and Methods for Making Such Probes | 140-A |
| 11/029,180 - Jan. 3, 2005<br>2005-0184748 - Aug. 25, 2005<br>— | Chen, et al. "Pin-Type Probes for Contacting Electronic Circuits and Methods for Making Such Probes" | 139-A |
| 11/029,217 - Jan. 3, 2005<br>2005-0221644 - Oct. 6, 2005<br>7,412,767 - Aug. 19, 2008 | Kim, et al., "Microprobe Tips and Methods for Making" | 122-A |
| 11/173,241 - Jun. 30, 2005<br>2006-0108678 - May 25, 2006<br>— | Kumar, et al., Probe Arrays and Method for Making | 137-A |
| 11/178,145 - Jul. 7, 2005<br>2006-0112550 - Jun. 1, 2006<br>7,273,812 - Sep. 25, 2007 | Kim, et al., "Microprobe Tips and Methods for Making" | 136-B |
| 11/325,404 - Jan. 3, 2006<br>2006-0238209 - Oct. 26, 2006<br>— | Chen, et al., "Electrochemically Fabricated Microprobes" | 153-A |
| 14/986,500 - Dec. 31, 2015<br>2016-0231356 - Aug. 11, 2016<br>10,215,775 - Feb. 26, 2019 | Wu, et al. "Multi-Layer, Multi-Material Micro-Scale and Millimeter-Scale Devices with Enhanced Electrical and/or Mechanical Properties" | 296-D |
| 16/172,354 - Oct. 18, 2018<br>2019-0204354 - Jul. 4, 2019<br>— | Chen, et al. "Pin-Type Probes for Contacting Electronic Circuits and Methods for Making Such Probes" | 366-A |
| 16/584,818 - Sep. 26, 2019<br>—<br>— | Smalley, "Probes Having Improved Mechanical and/or Electrical Properties for Making Contact between Electronic Circuit Elements and Methods for Making" | 376-A |

| U.S. patent application No., Filing Date U.S. application Pub. No., Pub. Date U.S. Pat. No., Pub. Date | First Named Inventor, "Title" | Dkt. No. Fragment |
|---|---|---|
| 16/584,863 - Sep. 26, 2019 — — | Frodis, "Probes Having Improved Mechanical and/or Electrical Properties for Making Contact between Electronic Circuit Elements and Methods for Making" | 377-A |
| 62/805,589 - Feb. 14, 2019 | Frodis, "Multi-Beam Vertical Probes with Independent Arms Formed of a High Conductivity Metal for Enhancing Current Carrying Capacity and Methods for Making Such Probes" | 370-A |
| 62/955,781 - Dec. 31, 2019 | Veeramani, "Probes with Planar Unbiased Spring Elements for Electronic Component Contact and Methods for Making Such Probes" | 379-A |
| 62/985,859 - Mar. 5, 2020 | Veeramani, "Probes with Planar Unbiased Spring Elements for Electronic Component Contact and Methods for Making Such Probes" | 379-B |
| 17/139,925 - Dec. 31, 2020 | Veeramani, "Probes with Planar Unbiased Spring Elements for Electronic Component Contact and Methods for Making Such Probes" | 398-A |
| 17/139,936 - Dec. 31, 2020 | Wu, et al., "Probes with Multiple Springs, Methods for Making, and Methods for Using" | 400-A |
| 17/139,940 - Dec. 31, 2020 | Wu, "Compliant Pin Probes with Flat Extension Springs, Methods for Making, and Methods for Using" | 401-A |

Electrochemical Fabrication:

Electrochemical fabrication techniques for forming three-dimensional structures from a plurality of adhered layers have been, and are being, commercially pursued by Microfabrica® Inc. (formerly MEMGen Corporation) of Van Nuys, California under the process names EFAB and MICA FREEFORM®.

Various electrochemical fabrication techniques were described in U.S. Pat. No. 6,027,630, issued on Feb. 22, 2000 to Adam Cohen.

A related method for forming microstructures using electrochemical fabrication techniques is taught in U.S. Pat. No. 5,190,637 to Henry Guckel, entitled "Formation of Microstructures by Multiple Level Deep X-ray Lithography with Sacrificial Metal Layers".

Electrochemical Fabrication provides the ability to form prototypes and commercial quantities of miniature objects, parts, structures, devices, and the like at reasonable costs and in reasonable times. In fact, Electrochemical Fabrication is an enabler for the formation of many structures that were hitherto impossible to produce. Electrochemical Fabrication opens the spectrum for new designs and products in many industrial fields. Even though Electrochemical Fabrication offers this capability and it is understood that Electrochemical Fabrication techniques can be combined with designs and structures known within various fields to produce new structures, certain uses for Electrochemical Fabrication provide designs, structures, capabilities and/or features not known or obvious in view of the state of the art.

A need exists in various fields for miniature devices having improved characteristics, improved operational capabilities, reduced fabrication times, reduced fabrication costs, simplified fabrication processes, greater versatility in device design, improved selection of materials, improved material properties, more cost effective and less risky production of such devices, and/or more independence between geometric configuration and the selected fabrication process.

SUMMARY OF THE INVENTION

It is an object of some embodiments of the invention to provide improved compliant pin probes with multiple substantially planar spring segments existing in parallel and connected in series and/or in parallel with sheaths or other rails, slots, channels, spring connector arms, and/or other engagement structures providing reduction or elimination of excessive lateral deflection of the compressive spring segments (e.g. in the case of planar spring segments, in a direction normal to the faces of the spring segments but potentially also in a direction that is perpendicular to the normal and to a local longitudinal axis of the probe).

It is an object of some embodiments of the invention to provide improved probe arrays.

It is an object of some embodiments of the invention to provide methods for making improved probes.

It is an object of some embodiments of the invention to provide a probe having a larger width of a compressive element than of a neighboring tensional element.

It is an object of some embodiments of the invention to provide a probe with a tensional sheath slot that is narrower than a width of a compressive element.

It is an object of some embodiments of the invention to provide a probe with adjacent tensional and compressional slots that are laterally shifted.

It is an object of some embodiments of the invention to provide a probe with tensional and compressive slots separated along their lengths and at least partially along their widths by a barrier structure.

It is an object of some embodiments of the invention to provide a probe that has a movable contact tip on a first end and a movable contact tip on an opposite second end.

It is an object of some embodiments of the invention to provide a probe that has at least one movable contact tip on a first end with the other end of the probe having a structure that is configured to be bonded or attached to an electrical interface.

It is an object of some embodiments of the invention to provide a probe with a sheath that has at least one end cap that restrains excessive longitudinal movement of at least one tip from that end of the probe.

It is an object of some embodiments of the invention to provide a probe that has at least two movable contact tips for contacting different electronic components.

It is an object of some embodiments of the invention to provide a probe with the sheath having at least two end caps that restrain excessive longitudinal movement of the tips from either end of the probe.

It is an object of some embodiments of the invention to provide a probe that is configured to provide shunting of a majority of the current through a sheath as opposed to through a majority of the length of the spring elements or spring segments.

It is an object of some embodiments of the invention to provide a probe with a configuration that provides a compliant element attached to the sheath that is in direct or indirect sliding contact with a moving tip.

It is an object of some embodiments of the invention to provide a probe with a configuration that provides a compliant element attached directly or indirectly to a moving tip and that is in direct or indirect sliding contact with a sheath.

It is an object of some embodiments of the invention to provide a method of forming a probe, or a plurality of probes simultaneously, with at least a portion of each of the plurality of spring segments of a probe formed within an opening in a sheath.

It is an object of some embodiments of the invention to provide a method of forming a probe, or a plurality of probes simultaneously, with all of the plurality of spring segments of a probe formed within an opening in a sheath.

It is an object of some embodiments of the invention to provide a probe with a sheath that is formed in multiple components, with the sheath components pushed longitudinally together after formation to load the spring segments and to join the multiple components.

It is an object of some embodiments of the invention to provide a probe with an engagement feature or features that inhibits or inhibit unjoining of components after a compliant element or segment is moved sufficiently for the engagement of the engagement feature or features.

It is an object of some embodiments of the invention to provide a probe with at least some spring segments that undergo compressive loading when transitioning from a build configuration to a working configuration (e.g. via sufficient movement of a compliant element such that an engagement feature or features inhibit movement back to a build configuration.

Other objects and advantages of various embodiments of the invention will be apparent to those of skill in the art upon review of the teachings herein. The various embodiments of the invention, set forth explicitly herein or otherwise ascertained from the teachings herein, may address one or more of the above objects alone or in combination, or alternatively may address some other object ascertained from the teachings herein. It is not intended that any one of the above noted objects be addressed by any particular aspect of the invention as such aspect may address some other need or object that will be apparent to those of skill in the art upon review of the teachings set forth herein.

In a first aspect of the invention, a probe for testing a DUT, including: (a) a first tip for making electrical contact to an electrical circuit element, the first tip having a contact region and an attachment region; (b) a first extension arm connecting directly or indirectly to the attachment region of the first tip; (c) a compliant structure including at least one spring segment, wherein a first region of the compliant structure joins the first extension arm; (d) a second extension arm joining a second region of the compliant structure such that relative displacement of the first and second extension arms results in elastic movement of the at least one spring segment of the compliant structure; (e) a second tip having an attachment region and a contact region wherein the attachment region joins the second extension arm; and (f) a guidance structure that limits elastic movement of the compliant structure to substantially longitudinal movement along an axis of the probe, wherein the at least one spring segment operates under compression to provide an elastic restoration force.

Numerous variations of the first aspect of the invention are possible and include, for example: (1) the at least one spring segment including a plurality of spring segments with at least one of the spring segments operating under tension; (2) the first variation with at least a plurality of the spring segments operating under compression to provide a restoring force; (3) the probe additionally including stop structures that allow for pre-biasing at least one spring segment; (4) the probe additionally including features that can engage with features on an array structure such that pre-biasing of at least one spring segment occurs prior to putting the probe into usage; (5) the probe additionally including at least one shunting structure that directs current from one of the first or second extension arms through a non-compliant structure and then through the other of the first or second extension arm; (6) the fifth variation with the shunting structure being a surface against which the extension arm slides; (7) the at least one spring segment including a metal material and being provided in a flat spring configuration; (8) the seventh variation with the at least one spring segment including at least two spring segments that are joined together in a serial configuration; (9) the eighth variation with the at least two joined spring segments operating in compression; (10) the seventh variation with the at least one flat spring segment including at least two flat spring segments wherein the two flat spring segments are spaced from one another but at least partially overlay one another in a face-to-face configuration; (11) the tenth variation with the two flat spring segments being separated from one another by an intermediate surface against which at least one of the segments can slide; (12) the eleventh variation further including a sheath in which the compliant structure moves; and (13) the probe being configured to have a first guide path for movement of a compression segment having a configuration selected from the group consisting of: (a) the first guide path is wider than a neighboring guide path for an adjacent spring segment; (b) the first guide path overlaps but is offset from a neighboring guide path for an adjacent spring segment; (c) the first guide path is bounded by a barrier material that at least partially separates the first guide path from a neighboring guide path such that the barrier material allows for separation of the spring segments in neighboring paths while providing a smooth or low friction surface against which the compression segment can slide; (d) the first guide path provides a rail on which the compression spring can move with at least one of the compression springs or the rail providing at least a partial side wall, lip, or plurality of extended features that inhibit the compression spring from moving an excessive amount laterally (e.g. an amount that could cause current to flow in an unintended path, an amount that could cause binding of the segment or could otherwise hinder smooth operation of the spring either during forced compression or during elastic return to a less biased state).

In a second aspect of the invention, a probe for testing a DUT, including: (a) a first tip for making electrical contact to an electrical circuit element, the first tip having a contact region and an attachment region; (b) a first extension arm connecting directly or indirectly to the attachment region of the first tip; (c) a compliant structure including at least one spring segment, wherein a first region of the compliant structure joins the first extension arm; (d) a second extension arm joining a second region of the compliant structure such that relative displacement of the first and second extension arms results in elastic movement of the at least one spring segment of the compliant structure; (e) a second tip having a first attachment region and a second attachment region wherein the first attachment region of the second tip joins the second extension arm; and (f) a guidance structure that limits elastic movement of the compliant structure to substantially longitudinal movement along an axis of the probe, wherein the at least one spring segment operates under compression to provide an elastic restoration force, and wherein the second attachment region of the second tip is configured for attachment to a location on a second circuit element to which the probe is to be joined.

Numerous variations of the second aspect of the invention are possible and include, for example, those noted with regard to the first aspect.

In a third aspect of the invention, a probe for testing a DUT, including: (a) a first tip for making electrical contact to an electrical circuit element, the first tip having a contact region and an attachment region; (b) a first extension arm connecting directly or indirectly to the attachment region of the first tip; (c) a compliant structure including at least one spring segment, wherein a first region of the compliant structure joins the first extension arm; (d) a second extension arm joining a second region of the compliant structure such that relative displacement of the first and second extension arms results in elastic movement of the at least one spring segment of the compliant structure; (e) a second tip having a first attachment region and a second region wherein the first attachment region of the second tip joins the second extension arm; and (f) a guidance structure that limits elastic movement of the compliant structure to substantially longitudinal movement along a longitudinal axis of the probe, wherein the at least one spring segment operates under compression to provide an elastic restoration force, and wherein the second region of the second tip is configured for making an electrical connection to a second circuit element, wherein the configuration is selected from the group consisting of: (1) a tip for making a contact connection, and (2) a tip for making an attached connection.

Numerous variations of the third aspect of the invention are possible and include, for example, those noted with regard to the first aspect.

In a fourth aspect of the invention, a probe for testing a DUT, including: (a) a first tip for making electrical contact to an electrical circuit element, the first tip having a first contact region and a first connection region; (b) a first extension arm connecting directly or indirectly to the first connection region of the first tip; (c) a compliant structure including at least one first spring segment, and wherein a first region of the compliant structure connects directly or indirectly to the first extension arm; (d) a second extension arm connecting directly or indirectly to a second connection region of the compliant structure such that relative displacement of the first extension arm and the second extension arm results in elastic movement of the at least one first spring segment of the compliant structure; (e) a second tip having a first connection region and a second region wherein the first connection region joins the second extension arm; and (f) at least one guidance element that limits relative movement of the first tip and the second tip along a substantially longitudinal axis of the probe, wherein the at least one spring undergoes increased compression upon relative displacement of the first tip and the second tip toward one another along the longitudinal axis of the probe, and wherein the second region of the second tip is configured for making an electrical connection to a second circuit element, wherein the configuration is selected from the group consisting of: (1) a tip for making a contact connection, and (2) a tip for making an attached connection.

Numerous variations of the fourth aspect of the invention are possible and include, for example, those noted with regard to the first aspect.

In a fifth aspect of the invention, a probe for testing a DUT, including: (a) a first tip for making electrical contact to an electrical circuit element, the first tip having a first contact region and a first connection region; (b) a first extension arm connecting directly or indirectly to the first connection region of the first tip; (c) a compliant structure including at least one first spring segment, and wherein a first region of the compliant structure connects directly or indirectly to the first extension arm; (d) a second extension arm connecting directly or indirectly to a second connection region of the compliant structure such that relative displacement of the first extension arm and the second extension arm results in elastic movement of the at least one first spring segment of the compliant structure; (e) a second tip having a first connection region and a second region wherein the first connection region joins the second extension arm, wherein the at least one spring undergoes increased compression upon relative displacement of the first tip and the second tip toward one another along the longitudinal axis of the probe, and wherein the second region of the second tip is configured for making an electrical connection to a second circuit element, wherein the configuration is selected from the group consisting of: (1) a tip for making a contact connection, and (2) a tip for making an attached connection.

Numerous variations of the fifth aspect of the invention are possible and include, for example, those noted with regard to the first aspect.

In a sixth aspect of the invention, a probe for testing a DUT, including: (a) a first tip for making electrical contact to an electrical circuit element, the first tip having a first contact region and a first connection region; (b) a first extension arm connecting directly or indirectly to the first connection region of the first tip; (c) a compliant structure including at least one first spring segment, and wherein a first region of the compliant structure connects directly or indirectly to the first extension arm; (d) a second extension arm connecting directly or indirectly to a second connection region of the compliant structure such that relative displacement of the first extension arm and the second extension arm results in elastic movement of the at least one first spring segment of the compliant structure; (e) a second tip having a first connection region and a second region wherein the first connection region joins the second extension arm; (f) at least one guidance element that limits relative movement of the first tip and the second tip along a substantially longitudinal axis of the probe, and (g) at least one structure that is directly or indirectly attached to an end of the at least one spring for providing a function selected from the group consisting of: (1) providing a stop structure that moves with the end of the spring as a first tip and second tip are moved relative to one another; and (2) providing for relative longitudinal motion of the first tip relative to the second tip while inhibiting excessive lateral motion of at least one of the first tip or the second tip, wherein the at least one spring undergoes increased compression upon relative displacement of the first tip and the second tip toward one another along the longitudinal axis of the probe, and wherein the second region of the second tip is configured for making an electrical connection to a second circuit element, wherein the configuration is selected from the group consisting of: (1) a tip for making a contact connection, and (2) a tip for making an attached connection.

Numerous variations of the sixth aspect of the invention are possible and include, for example, those noted with regard to the first aspect.

In a seventh aspect of the invention, a probe for testing a DUT, including: (a) a first tip for making electrical contact to an electrical circuit element, the first tip having a first contact region and a first connection region; (b) a first extension arm connecting directly or indirectly to the first connection region of the first tip; (c) a compliant structure including at least one first spring segment, and wherein a first region of the compliant structure connects directly or indirectly to the first extension arm; (d) a second extension arm connecting directly or indirectly to a second connection region of the compliant structure such that relative displacement of the first extension arm and the second extension arm results in elastic movement of the at least one first spring segment of the compliant structure; (e) a second tip having a first connection region and a second region wherein the first connection region joins the second extension arm; and (f) a rigid probe body providing a frame which supports the relative lateral positioning of the compliant structure, the first extension arm, and the second tip extension arm while allowing at least one of the first extension arm and first tip or the second extension arm and second tip to move longitudinally, via an external compressive force applied to the first and/or second tips, through a working range of longitudinally extended probe length to longitudinally compressed probe length while increasing a tensional force on the at least one first spring segment and moving longitudinally through a working range of longitudinally compressed probe length to extended probe length under a force of extension provided, at least in part, by the tensional force stored in the at least one first spring segment, wherein the rigid probe body extends from at least one end of the at least one first spring segment to the other end of the at least one first spring segment at a full working extension of the at least one first spring segment, wherein the at least one spring undergoes increased compression upon relative displacement of the first tip and the second tip toward one another along the longitudinal axis of the probe, and wherein the second region of the second tip is configured for making an electrical connection to a second circuit element, wherein the configuration is selected from the group consisting of: (1) a tip for making a contact connection, and (2) a tip for making an attached connection.

Numerous variations of the seventh aspect of the invention are possible and include, for example, those noted with regard to the first aspect.

In an eighth aspect of the invention, a probe array for testing a DUT, including: (1) at least one array structure having a plurality of openings defining at least in part lateral positions of a plurality of probes; and (2) a plurality of probes located in the plurality of openings, wherein each of the plurality of probes includes a probe selected from the group consisting of: (1) Aspect 1; (2) Aspect 2, (3) Aspect 3; (4) Aspect 4, (5) Aspect 5; and (6) Aspect 6; and (7) Aspect 7.

Numerous variations of the eighth aspect of the invention are possible and include, for example, those noted with regard to the first aspect.

In a ninth aspect of the invention, a probe including: (a) a sheath; (b) a plurality of flat spring segments having edges and faces, located in parallel with their faces facing each other and connected directly (without an intervening element) or indirectly (with an intervening element), (c) at least one contact tip arm connected directly or indirectly to at least one of the plurality of spring segments and with another end of the contact arm connected directly or indirectly to a contact tip; (d) at least one additional second tip arm connected directly or indirectly to another of the plurality of spring segments and with another end of the second tip arm connected to a tip with a configuration selected from the group consisting of: (1) a contact tip, and (2) an attachment tip; wherein the sheath at least partially encases at least one of the flat spring segments; wherein at least one of the spring segments is a compressive spring segment and undergoes compression when probe tips are pressed toward one another; wherein the at least one spring segment that undergoes compression is inhibited from excessive deflection in a direction perpendicular to a plane in which the flat spring segment resides, when unbiased, by a fixed portion of the sheath; wherein a second of the plurality of flat spring segments is selected from the group consisting of: (1) a compressional spring segment, and (2) a tensional spring segment, and wherein the plurality of flat spring segments are connected directly or indirectly together in a manner selected from the group consisting of: (1) in series, (2) in parallel, and (3) a combination of serial and parallel connections.

Numerous variations of the ninth aspect of the invention are possible and include, for example, some of those noted with regard to the first aspect. Additional variations, for example, include: (1) the plurality of spring segments having configurations selected from the group consisting of: (a) a serpentine pattern, (b) a repeated pattern with C-shaped elements, (c) a repeated pattern with S-shaped elements, (d) a repeated pattern with pattern angled elements where the angles are under 90°, (e) a repeated pattern with saw-tooth shaped elements, (f) a repeated pattern with angled elements where the angles are 90°, (g) a repeated pattern with sine-shaped elements; (2) the compressive segment having a compressive width that is captured at least around its edges and a portion of its front and back faces by elements defining a compressive movement slot that inhibits excessive non-longitudinal movement of the compressive segment; (3) the second variation with the second of the flat spring segments being a tensional spring segment that undergoes extension when the probe tips are pressed toward one another; (4) the third variation with the probe additionally including a sheath having a compressive slot with a compressive width for compressive movement of the compressive segment while the sheath also has a tensional slot with a tensional width for tensional movement of the tensional segment, wherein the compressive width is larger than the tensional width and wherein the tensional width is smaller than the compressive width of the compressive segment; (5) the third variation with the probe additionally including a sheath having a compressive slot with a compressive width for compressive movement of the compressive segment while the sheath also has a tensional slot with a tensional width for tensional movement of the tensional segment, wherein the compressive slot is shifted from the tensional slot such that the compressive slot and the tensional slot only partially overlap in a direction perpendicular to the planes of the flat spring segments; and (6) the first variation with the probe additionally including a sheath having a plurality of slots, each slot separated by a fixed barrier structure wherein the at least one of compressive spring segment moves within a compressive slot while at least one of the other spring segments moves within a different slot.

Still other aspects of the invention will be understood by those of skill in the art upon review of the teachings herein. Other embodiments and aspects of the invention may involve combinations of the features or elements of above noted aspects of the invention and the embodiments set forth hereafter, for example: (1) features found in the various aspects, embodiments, variations of specific aspects, or variations of specific embodiments that would be useful in combination, or (2) removal or modification of various features that are taught in association with a specific aspect or embodiment that would be understood to be optional to one of skill in the art upon review of the teachings herein.

These other aspects of the invention may provide various combinations of the aspects presented above as well as provide other configurations, structures, functional relationships, and processes that have not been specifically set forth above but are taught by other specific teachings set forth herein or by the teachings set forth herein as a whole.

The disclosure of the present invention provides numerous device embodiments. Such devices may be formed, in whole or in part, using a multi-layer, multi-material fabrication process wherein each successively formed layer includes at least two materials, one of which is a structural material and the other of which is a sacrificial material, and wherein each successive layer defines a successive cross-section of the three-dimensional structure, and wherein the forming of each of the plurality of successive layers includes: (i) depositing a first of the at least two materials; (ii) depositing a second of the at least two materials; and (B) after the forming of the plurality of successive layers, separating at least a portion of the sacrificial material from the structural material to reveal the three-dimensional structure. In some embodiments, each of the at least one structural material is a metal while in others, the at least one structural material includes at least two structural materials with at least one of the at least two structural materials being a dielectric. In some embodiments, materials deposited in association with the formation of specific layers are planarized to set a boundary for the specific layers. In some embodiments, such devices may be formed individually while in others, they may be formed in batch. In some embodiments, devices formed by the above methods may be released from a substrate while in others, they may remain attached thereto.

BRIEF DESCRIPTION OF THE DRAWINGS

FIG. 2A provides a schematic representation of a probe according to a first embodiment of the invention where the probe includes first to third serially connected springs or spring segments with the first segment connected to an upper tip arm and the third segment connected to a lower tip arm wherein during use of the probe the first and third segments operate in compression while the middle segment operates in tension.

FIG. 2B provides an isometric view of a probe that includes two tips, a shield or sheath that encloses three, flat, face-to-face, serially connected spring segments that have the same operational configuration as the probe of FIG. 2A.

FIG. 2C shows an edge view of each of the three spring segments of the probe of FIG. 2B while FIGS. 2C-B and 2C-T show expanded views of the bottom and top of the spring segments and how they are connected to one another.

FIG. 2C-FT shows a forward tilted front-top view of the springs of the probe of FIG. 2B so that the winding configuration of the top spring can be seen.

FIG. 2D shows a cut view of the probe of FIG. 2B so that each of the springs may be seen along with a surrounding sheath wherein the first (top) and third (bottom) compression springs can be seen as being located in wider channels than the second spring (middle) such that the bounding edges of the slot in which the middle spring operates, captures, and holds the top and bottom springs within their channels (i.e. keeps them from bulging out of their respective channels during compression).

FIGS. 4A and 4B illustrate two versions of a probe according to another embodiment of the invention wherein the probes are shown in cut longitudinal cross-sectional views, where the probe functionalities are similar to that of the embodiment of FIGS. 3A and 3B where guidance and stability are provided by a combination of a sliding ring at the top of the spring and an elongate sheath like structure.

FIGS. 10-1 to 10-4 provide a number of isometric views of a probe and expanded sections of the probe according to another embodiment of the invention where the probe provides a specific implementation of spring and guide functionality illustrated in the schematic of FIG. 9.

DETAILED DESCRIPTION OF PREFERRED EMBODIMENTS

Electrochemical Fabrication in General

Figure 1A:
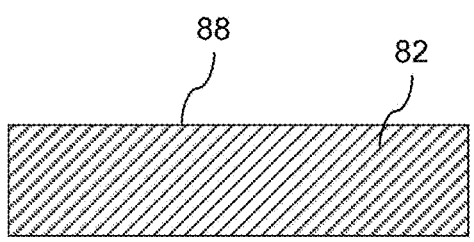
FIGS. 1A-1F schematically depict the formation of a first layer of a structure using adhered mask plating where the blanket deposition of a second material overlays both the openings between deposition locations of a first material and the first material itself.
Figure 1B:
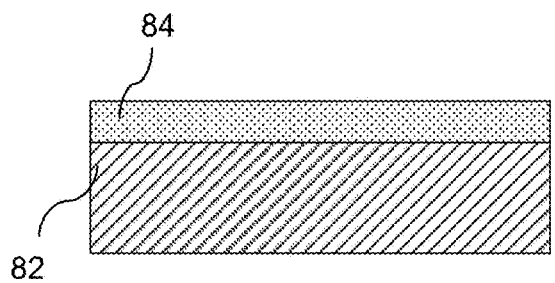
Figure 1C:
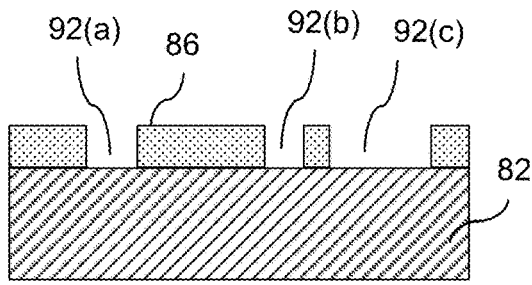
Figure 1D:
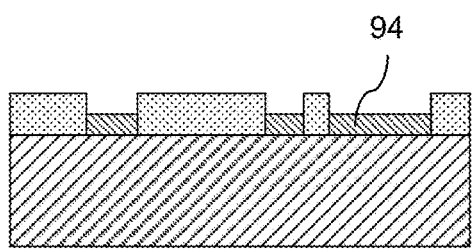
Figure 1E:
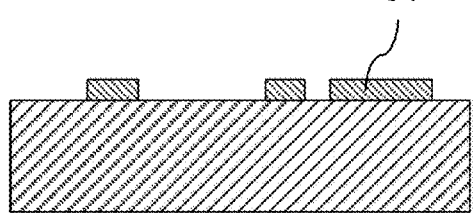
Figure 1F:
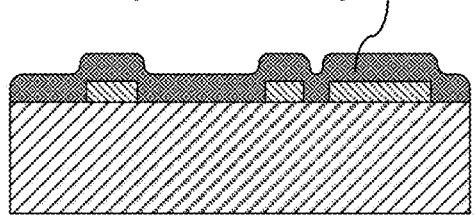
Figure 1G:
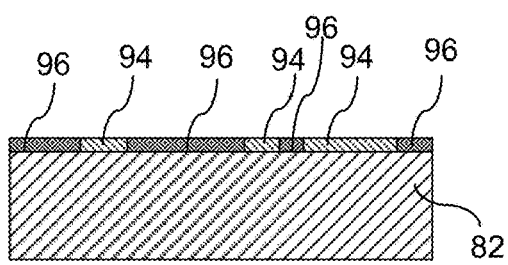
FIG. 1G depicts the completion of formation of the first layer resulting from planarizing the deposited materials to a desired level.
Figure 1H:
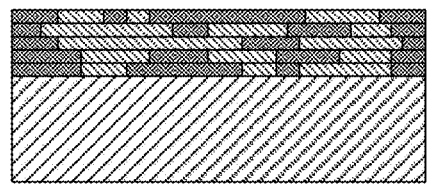
FIGS. 1H and 1I respectively depict the state of the process after formation of the multiple layers of the structure and after release of the structure from the sacrificial material.
Figure 1I:
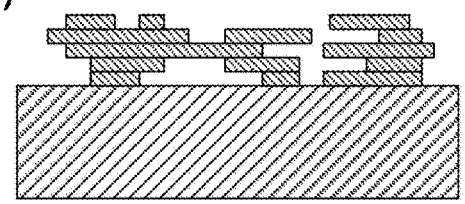

FIGS. 1A-1I illustrate side views of various states in an alternative multi-layer, multi-material electrochemical fabrication process. FIGS. 1A-1G illustrate various stages in the formation of a single layer of a multi-layer fabrication process where a second metal is deposited on a first metal as well as in openings in the first metal so that the first and second metals form part of the layer. In FIG. 1A, a side view of a substrate 82 having a surface 88 is shown, onto which patternable photoresist 84 is deposited, spread, or cast as shown in FIG. 1B. In FIG. 1C, a pattern of resist is shown that results from the curing, exposing, and developing of the resist. The patterning of the photoresist 84 results in openings or apertures 92(a)-92(c) extending from a surface 86 of the photoresist through the thickness of the photoresist to surface 88 of the substrate 82. In FIG. 1D, a metal 94 (e.g. nickel) is shown as having been electroplated into the openings 92(a)-92(c). In FIG. 1E, the photoresist has been removed (i.e. chemically or otherwise stripped) from the substrate to expose regions of the substrate 82 which are not covered with the first metal 94. In FIG. 1F, a second metal 96 (e.g. silver) is shown as having been blanket electroplated over the entire exposed portions of the substrate 82 (which is conductive) and over the first metal 94 (which is also conductive). FIG. 1G depicts the completed first layer of the structure which has resulted from the planarization of the first and second metals down to a height that exposes the first metal and sets a thickness for the first layer. In FIG. 1H, the result of repeating the process steps shown in FIGS. 1B-1G several times to form a multi-layer structure is shown where each layer consists of two materials. For most applications, one of these materials is removed as shown in FIG. 1I to yield a desired 3-D structure 98 (e.g., component or device) or multiple such structures.

In some variations, the structure may be separated from the substrate. For example, release of the structure (or multiple structures if formed in a batch process) from the substrate may occur when releasing the structure from the sacrificial material particularly when a layer of sacrificial material is positioned between the first layer of the structure and the substrate. Alternative methods may involve, for example, the use of a dissolvable substrate that may be separated before, during or after removal of the sacrificial material, machining off the substrate before or after removal of the sacrificial material or use of a different intermediate material that can be dissolved, melted or otherwise used to separate the structure(s) from the substrate before, during, or after removal of the sacrificial material that surround the structure(s).

Various embodiments of various aspects of the invention are directed to formation of three-dimensional structures from materials, some, or all, of which may be electrodeposited or electroless deposited (as illustrated in FIGS. 1A-1I and as discussed in various patents and patent applications incorporated herein by reference). Some of these structures may be formed from a single build level (e.g. a planarized layer) that is formed from one or more deposited materials while others are formed from a plurality of build levels, each including at least two materials (e.g. two or more layers, more preferably five or more layers, and most preferably ten or more layers). In some embodiments, layer thicknesses may be as small as one micron or as large as fifty microns. In other embodiments, thinner layers may be used while in other embodiments, thicker layers may be used, while in still other embodiments, layer thickness may be varied during formation of different levels of the same structure. In some embodiments, microscale structures have lateral features positioned with 0.1-10 micron level precision and minimum feature sizes on the order of microns to tens of microns. In other embodiments, structures with less precise feature placement and/or larger minimum features may be formed. In still other embodiments, higher precision and smaller minimum feature sizes may be desirable. In the present application, meso-scale and millimeter-scale have the same meaning and refer to devices that may have one or more dimensions that may extend into the 0.1-50 millimeter range, or larger, and features positioned with a precision in the micron to 100 micron range and with minimum feature sizes on the order of several microns to hundreds of microns.

The various embodiments, alternatives, and techniques disclosed herein may form multi-layer structures using a single patterning technique on all layers or using different patterning techniques on different layers. For example, various embodiments of the invention may perform selective patterning operations using conformable contact masks and masking operations (i.e. operations that use masks which are contacted to but not adhered to a substrate), proximity masks and masking operations (i.e. operations that use masks that at least partially selectively shield a substrate by their proximity to the substrate even if contact is not made), non-conformable masks and masking operations (i.e. masks and operations based on masks whose contact surfaces are not significantly conformable), adhered masks and masking operations (masks and operations that use masks that are adhered to a substrate onto which selective deposition or etching is to occur as opposed to only being contacted to it), and/or selective patterned deposition of materials (e.g. via extrusion, jetting, or controlled electrodeposition) as opposed to masked patterned deposition. Conformable contact masks, proximity masks, and non-conformable contact masks share the property that they are preformed and brought to, or in proximity to, a surface which is to be treated (i.e. the exposed portions of the surface are to be treated). These masks can generally be removed without damaging the mask or the surface that received treatment to which they were contacted or located in proximity to. Adhered masks are generally formed on the surface to be treated (i.e. the portion of that surface that is to be masked) and bonded to that surface such that they cannot be separated from that surface without being completely destroyed or damaged beyond any point of reuse. Adhered masks may be formed in a number of ways including: (1) by application of a photoresist, selective exposure of the photoresist, and then development of the photoresist, (2) selective transfer of pre-patterned masking material, and/or (3) direct formation of masks from computer-controlled depositions of material. In some embodiments, adhered mask material may be used as a sacrificial material for the layer or may be used only as a masking material which is replaced by another material (e.g., dielectric or conductive material) prior to completing formation of a layer where the replacement material will be considered the sacrificial material of the respective layer. Masking material may or may not be planarized before or after deposition of material into voids or openings included therein.

Patterning operations may be used in selectively depositing material and/or may be used in the selective etching of material. Selectively etched regions may be selectively filled in or filled in via blanket deposition, or the like, with a different desired material. In some embodiments, the layer-by-layer build up may involve the simultaneous formation of portions of multiple layers. In some embodiments, depositions made in association with some layer levels may result in depositions to regions associated with other layer levels (i.e., regions that lie within the top and bottom boundary levels that define a different layer's geometric configuration) . Such use of selective etching and/or interlaced material deposition in association with multiple layers is described in U.S. patent application Ser. No. 10/434,519, by Smalley, filed May 7, 2003, which is now U.S. Pat. No. 7,252,861, and which is entitled "Methods of and Apparatus for Electrochemically Fabricating Structures Via Interlaced Layers or Via Selective Etching and Filling of Voids". This referenced application is incorporated herein by reference.

Temporary substrates on which structures may be formed may be of the sacrificial-type (i.e., destroyed or damaged during separation of deposited materials to the extent they cannot be reused) or non-sacrificial-type (i.e., not destroyed or excessively damaged, i.e. not damaged to the extent they may not be reused, e.g. with a sacrificial or release layer located between the substrate and the initial layers of a structure that is formed). Non-sacrificial substrates may be considered reusable, with little or no rework (e.g., by planarizing one or more selected surfaces or applying a release layer, and the like) though they may or may not be reused for a variety of reasons.

Definitions of various terms and concepts that may be used in understanding the embodiments of the invention (either for the devices themselves, certain methods for making the devices, or certain methods for using the devices) will be understood by those of skill in the art. Some such terms and concepts are discussed herein while other such terms are addressed in the various patent applications to which the present application claims priority and/or which are incorporated herein by reference (e.g. U.S. patent application Ser. No. 16/584,818).

Probe Embodiments

Probes of the various embodiments of the invention can take on a variety of forms. Each probe includes multiple substantially flat spring segments with at least two springs configured to operate functionally in series or in parallel with the spring segments at least partially lying side-by-side or face-to-face as opposed to edge-to-edge or end-to-end. In some embodiments, probe deformation is limited to a compression along the axis of the probe (e.g. substantially longitudinal compression as probe tips or circuit joining elements move to more proximal positions).

Numerous variations of these probe embodiments are possible, including for example:

(1) use, or inclusion, of only compression springs or spring segments;

(2) use, or inclusion, of a combination of compression springs and extension springs;

(3) use, or inclusion, of multi-segment springs as a single effective spring;

(4) use, or inclusion, of multi-segment springs including springs in series with interconnecting bars, plates, or the like as necessary;

(5) use, or inclusion, of multi-segment springs including springs in parallel with interconnecting bars, plates, or the like as necessary;

(6) use, or inclusion, of multi-segment springs including springs grouped in a combination of parallel and series connections with interconnecting bars, plates, or the like as necessary;

(7) use, or inclusion, of individual springs having substantially linear behavior (e.g. $F=K*\Delta x$) or having non-linear behaviors;

(8) use, or inclusion, of individual spring segments having common or different spring constants;

(9) use, or inclusion, of springs or spring segments that are substantially flat (e.g. having substantially planar front and back surfaces when unbiased or having substantially flat profiles whether formed from a single layer, multiple layers or in some other manner);

(10) use, or inclusion, of springs or spring segments laying in different parallel but offset planes (e.g. each formed within a single layer or from a series of adjacent layers) with connection elements extending from one spring segment to another through one or more intermediate layers;

(11) use, or inclusion, of individual probes that include a fixed stop, or more than one fixed stop, which interacts with one or more movable stops or alternatively the one or more fixed stop may be part of an array mounting structure or array assembly which can engage the movable stop or stops once probes are loaded into the array structure or final assembly is completed;

(12) use, or inclusion, of individual probes including at least two fixed stops that may be used to bias one or more spring segments such that the one or more spring segments are pre-biased by at least two moving stops being on the inside (spring side) of their respective fixed stops for a spring that is compressed or both being on the outside of their respective stops for a spring that is operated as an extension spring (i.e. biased in an extended state);

(13) use, or inclusion, of individual probes that include three springs, or more, and two or more moving stops that contact fixed stops when their respective springs, if of the extension type, are compressed to a working limit or, if of the compression type, are made to extend to a working limit;

(14) use, or inclusion, of spring segments that are connected via flat, T-shaped, angled, or other bar or plate configurations that run between springs or spring segments on a single layer or via one or more intermediate layers that separate springs or spring segments;

(15) use, or inclusion, of spring segments that are connected via flat, T-shaped, angled, or other bar or plate configurations that run along the edges of the springs or spring segments on a single layer or via one or more layers;

(16) use, or inclusion, of guide elements (e.g. sheaths, rails, fixed or movable plates, slip rings, or the like) in probes with compression springs to ensure that compression springs do not laterally bulge excessively during compression (e.g. where unintended contact or interference with an adjacent spring or spring segment could occur or even unintended contact with a neighboring probe);

(17) use, or inclusion, of probe tips that may take on one or more forms including: flat surfaces, knife edge or blade-like structures, multi-contact crown-like configurations, single point contacts, single curved contact structures, or multiple curved contact structures;

(18) use, or inclusion, of tips that include the same material as the springs or that include a material that is different from a spring material,

(19) use, or inclusion, of a probe configuration that allows, during use, current to flow from one probe tip to another probe tip via at least one spring;

(20) use, or inclusion, of tips, tip extensions, springs, connection bars, sheaths, and/or the like may provide moving or non-moving (e.g. sliding) contacts between elements of a single probe to shunt part, most, or all of the current around spring elements;

(21) use, or inclusion, of incorporated dielectric elements to provide individual probes with isolated conductive regions (e.g. for coaxial or other multi-path probe structures) or to ensure electrically isolation of some probes from other probes;

(22) use, or inclusion, of selective electrical or dielectric connections from probes to guide plates or to other structures to provide desired lateral or longitudinally spacing of probes, alternate current flow paths, and/or to provide electrical shielding;

(23) use, or inclusion, of end regions or intermediate regions of probes that include sliding components or surfaces through which moving probe elements slide as shunting contact surfaces;

(24) use, or inclusion, of end regions or intermediate regions of probes that engage sliding components or surfaces of array or mounting structures against which probe shaft elements slide as shunting contact surfaces;

(25) use, or inclusion, of sliding surfaces of moving probe components or of fixed probe components that include different materials or have regions of different materials as compared to materials used in formation the bulk of spring segment elements.

(26) use, or inclusion, of probes that are formed using multi-layer, multi-material electrochemical fabrication methods in whole or in part;

(27) use, or inclusion, of probes that are formed as separate components or as partly connected or aligned components that need at least some assembly after formation of components;

(28) use, or inclusion, of probes that are formed in their entirety with all components formed together where build configurations are similar to their working configurations with possible exceptions of additional biasing required prior to use or where such biasing occurs upon initial use;

(29) use, or inclusion, of probes that are formed with all components formed in relation to one another with build configurations that are different from working configurations such that assembly is limited to movement of components from one configuration to another prior to use (e.g. compression or expansion of spring elements, snapping together of separated but aligned component features, sliding together or interlocking components, and the like);

(30) use, or inclusion, of probes that include stop features that do not engage moving stops upon probe formation but instead are made to engage moving stops upon compression or extension of their respective springs, or probe tips, by longitudinal sliding of engagement elements, lateral movement of engagement elements, rotational movement of engagement elements, or the like, where engagement may occur automatically upon initial spring movement, tip movement, or may be made to occur independently of spring or probe tip movement;

(31) use, or inclusion, of probes that include serpentine, saw-tooth, rectangular, triangular, sine-shaped, S-shaped, C-shaped, or numerous other configurations that provide elastic compliance over a working range of probe compression;

(32) use, or inclusion, of probes that are configured for 0.1 or smaller to 0.7 mm or large pitch, or larger (probe-to-probe spacing in an array);

(33) use, or inclusion, of probes that have body diameters or lateral dimensions (e.g., sheath, guide element, or spring width dimensions) ranging from 0.05 mm or less to 0.65 mm or more);

(34) use, or inclusion, of probes that have force targets (at maximum over-travel) from 1 gram or less to 100 grams or more (e.g., 2 g-40 g, 4 g-30 g, 6 g-20 g);

(35) use, or inclusion, of probes that have over-travel targets as low as 50 microns or less or as high as 1 mm or more (e.g., 200-800 microns or 400-600 microns);

(36) use, or inclusion, of probes that have dimensions that allow pre-loading to occur with a travel of slightly above zero microns to more than 400 microns (e.g., 20-400 microns, 50-300 microns, or 100-200 microns);

(37) use, or inclusion, of probes that have lengths on the order of 100 microns or less to 5 mm or more (e.g., 0.5 mm to 3 mm);

(38) use, or inclusion, of probes that are formed from layers with their longitudinal axes parallel to a build axis or stacking axes of the layers;

(39) use, or inclusion, of probes that are formed with their longitudinal axes laying in a plane perpendicular to a build axes or stacking axes of layers from which the probes are formed;

(40) use, or inclusion, of probes that are formed with their longitudinal axes laying in a plane perpendicular to a build axes and with a normal to the plane or planes of their spring segments also being perpendicular to the build axes when forming the probes from a plurality of stacked layers;

(41) use, or inclusion, of probes that are formed with their longitudinal axes laying in a plane perpendicular to a build axes and with a normal to the plane or planes of their spring segments being parallel to the build axes when forming the probes from a plurality of stacked layers;

(42) use, or inclusion, of curved lateral cross-sectional features of the probes being approximated by layer-to-layer stair stepping with the approximation dictated by the thickness of individual layers when probes are formed on their sides from a plurality of layers;

(43) use, or inclusion, of spring segments that are constrained upon use by being inside an outer body that forms part of the probes (e.g. sheath or framing structure);

(44) use, or inclusion, of spring segments that are constrained upon use by an internal frame structure that forms part of the probes;

(45) use, or inclusion, of probes with individual spring segments formed from a single layer, formed from two layers, or formed from more than two layers; and

(46) use, or inclusion, of probes that meet one or more of the following criteria: (1) have a total uncompressed working length of between 3-4 mm, (2) a spring length of 2.5-3.5 mm, (3) an over-travel of at least 300 microns, and (4) a maximum force at maximum over travel of 1.5-3.0 grams.

Numerous other variations are possible, some of which are explicitly or implicitly set forth herein while others will be apparent to those of skill in the art after review of the teachings herein. Some variations include using such probes in testing integrated circuits, dies on semiconductor wafers, or other electronic circuits. Other variations include assembly of a plurality of such probes into arrays for use in testing applications or for use in permanent contact applications. Further embodiments include methods for making such probes or making such arrays.

First Embodiment: Probe with Three Spring Segments and a Sheath Providing Narrow Channels for Extensions Springs and Wider Channels for Compression Springs FIG. 2A provides a schematic representation of a probe 200A according to a first embodiment of the invention where the probe includes a first tip arm 211 connected (directly or indirectly) to a first (upper) compression spring segment 201 that connects serially (directly or indirectly) to a second (middle) tension spring segment 202, that in turn connects serially (directly or indirectly) to a third (lower) compression spring segment 203 which in turn connects (directly or indirectly) to a second tip arm 212 where the spring segments may or may not have similar compressibility or expandability and may or may not have similar spring constants or other bias rate factors wherein in an actual probe, the spring segments would preferably, though not necessarily, at least partially overlap with a face-to-face orientation with or with intervening elements being located between the segments.

Various alternatives to the first embodiment are possible and include, for example: (1) the spring segments having different lengths, (2) the spring segments having different biasing rates (e.g. spring constants), (3) the spring segments having the same biasing rate, (4) the springs having different elastically compressible or extendable structures or patterns that allow a particular amount of compression or extension without exceeding elastic distortion limits of the material and their structural configuration—e.g. operational parameters maintain stress below yield strength limits of the materials and even substantially below those limits, e.g. at below 80% or even below 60%, or even below 40%; (4) the spring segments having one or more of flat rectangular wave shaped spring features, flat rectangular spring features connected by standoffs, flat sine wave shaped spring features, flat S-shaped spring features, flat C-shaped spring features, flat serpentine spring features, other planar spring features, non-planar spring features, helical shaped spring features, helical spring features with inward or outward spirals, and the like, (5) a fixed stop being part of the probe, (6) a fixed stop being part of an assembly structure the probe is fitted into, (7) probe tips having the same or different configurations such as those that might be useful for a flat pad, useful for engaging a solder bump, or useful for scratching through an oxide barrier that may be covering a contact surface, (8) probe tips being formed from the same material or materials, or a different material or materials compared to the spring elements, (9) probe tips being formed of different materials than that of the stop elements, (10) regions that provide for shunting contact between tips, stops, springs and framing, sheath, or assembly structures, (11) inclusion of dielectric materials in at least some contact regions for inhibiting electrical connections between probe elements or between a probe element and another structure, (12) inclusion of an isolating dielectric that may be backed by a first metal and fronted by a second metal, that is electrically isolated from the first metal and where the first and second metals may be the same or different materials; (13) inclusion of bonding materials or bonding enhancement materials that aid in attaching probe elements to one another or enable attaching of probe elements to other structures, (14) individual springs made up of multiple spring elements or segments that are connected by standoffs, spacers, bars, and the like to provide configurations that are serial, parallel, or a combination thereof, where the individual segments are spaced from one another but are located side-by-side, flat surface-to-flat surface, or end-to-end, and (15) inclusion of multiple segments with different spring segments operating in different modes (e.g. compression or extensions modes).

In some variations, one of the probe tips may be replaced with a fixed stop feature or may be bonded to another structure so as to function as a permanent or semi-permanent connection. In still other variations, the spring segments may have longitudinal lengths (e.g. tip-to-tip) appropriate for a selected application, e.g. 1 mm or less to 10 mm or more, the probes may have perpendicular lateral dimensions (that are also perpendicular to a local longitudinal axis of the probes) that are approximately the same or of different sizes, e.g. from about 1-to-1 to about 10-to-1 or more, lateral dimensions of the probe may allow arrays to be formed with pitches (probe-to-probe center spacings) as small as 50 ums or smaller and as large as 1 mm or larger with probe lateral dimensions ranging from tens of microns or smaller to hundreds of microns or larger, flat springs may have segment thicknesses as small as 10 microns or smaller or as large as 100 microns or larger, segment widths as small as 30 microns or smaller and as large as 200 microns or larger, and segment lengths as short as 1 mm or less (e.g. even 100 microns or smaller) and as large as 2 mm or larger (e.g. even up to 10 mm or more). Other variations may provide the probe with structural elements such as frames, guides, sheaths, and assembly engagement features that allow for spring protection, limit unintended spring movement or deflection, provide for controlled spring compression, provide for probe-to-probe spacing, and retention of elements within working range or biasing range requirements. Other variations are possible and may include features associated with other embodiments or variations or those features explicitly discussed elsewhere herein, implicit from the teachings provided herein, or ascertainable by those of skill in the art after review of the teachings herein.

FIG. 2B provides an isometric view of a probe 200B having a sheath, movable tips at either end (one in the form of a pointed structure 212T at the end of arm 212 and the other in the form of hollow rectangular cone or cup 211T at the end of arm 211) and three serially configured spring segments (hidden in the view of FIG. 2B) that join the tips to one another and allow for elastic behavior of the probe tips. FIG. 2C provides an edge view of the three serpentine spring segments of probe 200B (i.e., a side view showing layer stacking in Z and the longitudinal extents of the spring segments in Y). The view of FIG. 2C shows individual layers with the spring segments laying face-to-face. FIGS. 2C-B and 2C-T respectively show the bottoms and tops of the three spring segments of FIG. 2C showing how force is transferred from a compression of the upper tip of the combination of segments (which is at the upper end of the left most segment as shown in FIG. 2C-T) through to the bottom tip (which joins bottom of the right most segment as shown in FIG. 2C-B). The linkage allowing transfer of force (from compression of the left segment to tension on the middle segment) is shown in FIG. 2C-B while the linkage allowing transfer of force from tension on the middle segment to compression on the right segment is shown in FIG. 2C-T. FIG. 2C-FT provides a tilted front-top view of the stacked probe segments so that the serpentine nature of the segments may be better seen.

FIG. 2D provides a lateral cross-section view of the probe showing the three spring elements or segments 201, 202, and 203 located in a sheath 251 that provides different widths in X for each of the springs wherein the bottom spring 203 operates in compression and is provided with a wider movement channel compared to the middle segment 202 where the upper edges of the lower channel are capped by the inward extending walls for the middle channel. The narrower middle segment 202 operates in tension within the middle channel which in turn provides lower caps or flanges that hold the left and right edges of the wider upper compression spring segment 201 within the upper channel. In operation, the two compression springs may attempt to bow toward the middle tension spring when under load whereby the narrowed width of the middle spring channel and its edges inhibit excessive bowing of the upper and lower springs while still allowing them to slide in an unimpeded or minimally impeded manner. The middle spring is a tensioned spring and does not tend to bow laterally when under load as the tensional forces tend to pull the spring straight.

Second Embodiment: Probe with A Compression Spring and an Extension Spring

Figure 3A:
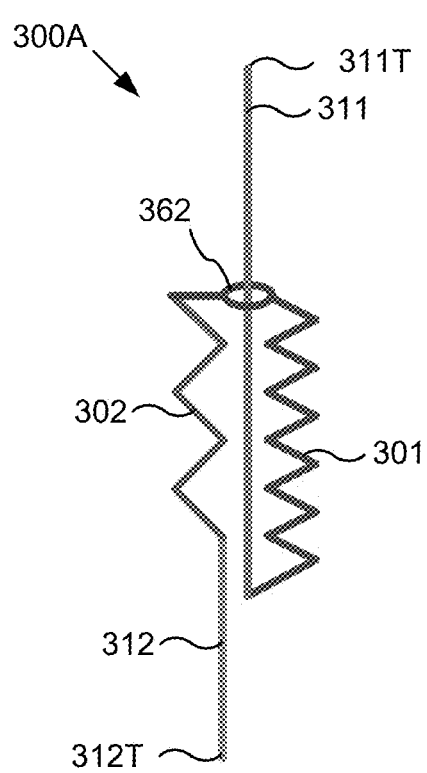
FIG. 3A provides a schematic representation of a probe according to another embodiment where the probe includes two springs with one operating in tension and the other in compression, two tip arms, and a movement stabilizer (e.g., a ring or other engagement structure) that provides improved probe stability.

FIG. 3A provides a schematic representation of a probe 300A according to another embodiment of the invention where the probe includes upper and lower tip arms 311 and 312 and associated tips, contact ends, or attachment ends 311T and 312T, along with a first extension spring segment 301 and a second compression spring 302 where the second spring segment is stiffer (e.g. has a larger spring constant and as such, has a lower compliance) than that of the first spring segment. Segments 301 and 302 are joined by a lateral connection arm and slip ring 362, or by a functionally equivalent structure.

Figure 3B:
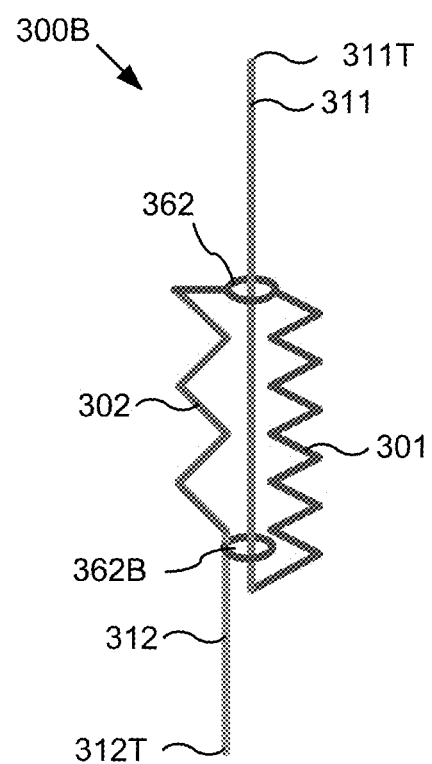
FIG. 3B provides a schematic representation of a probe according to another embodiment where the probe includes two springs with one operating in tension and the other operating in compression, two tip arms, and two movement stabilizers (e.g., rings or other structures with a first at the top of the spring segments and a second operating near the lower ends of the spring segments to provide an even further improvement to probe operational stability.

FIG. 3B provides a schematic representation of a modified version of the probe of FIG. 3A where the modification is the inclusion of a second slide ring stabilizing structure 362B operating near the lower ends of the spring segments to provide a further improvement to probe operational stability. The other probe features in FIG. 3B are referenced with the same numerals used with regard to FIG. 3A.

Numerous other variations of the embodiment of FIGS. 3A and 3B are possible and will be apparent to those of skill in the art upon review of the teachings herein.

Second Embodiment—Alternatives 2 & 3: Probe with Side-by-Side Springs (One Compressive and the Other Extensive) or with an Overlapping (Flat-to-Flat) Springs (One Compressive and the Other Extensive)

FIGS. 4A and 4B illustrate two versions of a probe 400A and 400B shown in cut longitudinal cross-sectional views, where the probe functionalities are similar to that of the embodiment of FIG. 3A (probe 300A) but where probe 400A has edge-to-edge spring segments 401 and 402 with the tip arm 411 positioned between the springs while probe 400B has spring segments spaced apart in Z instead of X with the arms 411 and 412 located between them but overlaid with one another face-to-face, side-to-side, or flat-to-flat, with each probe including one compression spring segment 402 with a lower arm 412 and tip 412T, one extension spring 401 with an upper arm 411 and tip 411T. The two spring segments in FIG. 4A may be separated by arm 411 and/or bounded by a bar or plate from the front and back or by channel that inhibits the compression spring segment from bowing, not only out of the plane of the paper when underload, but also from bowing within the plane of the paper and inhibiting free movement of itself or of the tension spring segment. In FIG. 4A, the spring segments are joined by a slip ring, a front side U shaped bar (e.g. a front half of a slip ring) or guide 462 that allows tip arm 411 to move freely relative to the connection that fixedly holds the upper portions of each spring together. In FIG. 4A, the arms 412 and 411 are connected to their respective spring segments at 416 and 417 respectively. In some variations, the connections between arms and springs or arms and slip rings may occur in a variety of different ways including bonding, welding, brazing, laser or ultrasonic welding, or the like during assembly or by formation of connected material during layer-to-layer build up (monolithic formation) during structural material deposition. In FIG. 4B, the spring segments may be at least partially separated by not only a spacing by also by barrier material (not shown) that inhibits the compression segment from bowing (underload) into the tensioned segment or by different sized sliding channels as shown in FIGS. 2A-2D or alternatively, for example, by channels that are offset from within the plane of the paper to provide a barrier to at least some amount of bowing. In FIG. 4B, the spring segments are joined by a slip ring, a front side U shaped bar (e.g., a front half of a slip ring) or guide 462 that allows tip arm 411 to move freely relative to the connection that fixedly holds the upper portions of each spring together. In FIG. 4B, the arms 412 and 411 are connected to their respective spring segments at 416 and 417 respectively. In some variations, the connections between arms and springs or arms and slip rings may occur in a variety of different ways including bonding, welding, brazing, laser or ultrasonic welding, or the like, during assembly or by formation of connected material during layer-to-layer build up (monolithic formation) during structural material deposition. In optimized embodiments of probes of the type exemplified in FIGS. 4A and 4B, lengths, positioning, and other configuration features associated with spring ends and tip arms provide for smooth motion of springs relative to one another such that the end of one arm or spring does not inadvertently engage with part of the other spring or arm to cause binding of sliding motion. In such embodiments, tip arms may be, but need not be, located between the springs. Numerous alternatives to the present embodiment exist and include, for example: (1) use of different tip configurations, (2) use of the same tip configuration on each end, (3) tips, arms and spring segments being formed from the same or different materials; (4) tips being connected by laterally extending arms to all probe tips to be co-linear; (5) shielding of the sheath existing at least over part of the front and back of the probes as opposed to only on the sides. In some variations the probe arms may provide part of the stabilization of compression spring position while in other embodiments additional guides or barriers may be used to provide such stabilization.

Figure 5:
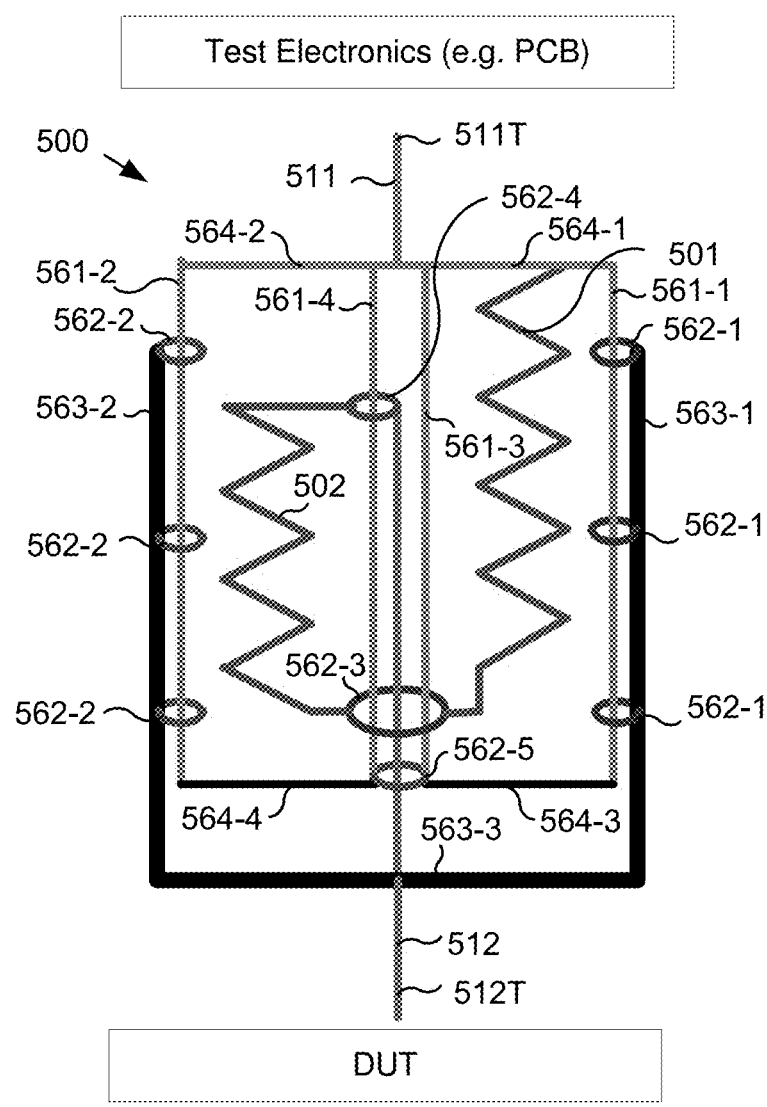
FIG. 5 provides a schematic representation of a probe according to another embodiment of the invention where the probe includes two spring segments with a first segment (on the left) operating in tension and a second segment (on the right) operating in compression, wherein the upper end of the first spring rigidly engages a lower frame structure and probe tip while the upper end of the second spring rigidly engages an upper frame structure and probe tip, and wherein the frame structures can move longitudinally relative to one another via a number of sliding guide structures.

Second Embodiment—Alternative 4: Probe with a Two-Segment Combination Spring (Compression and Tension Segments) and General Motion Stabilizing Guide Elements FIG. 5 provides a schematic representation of a probe 500 where tip 511T results in compression of spring 501 while movement of lower tip 512T results in extension of spring 502. Since the two springs 501 and 502 are joined at their lower ends by coupling and guide ring 562-3, the compressing of spring 501 has an impact on the net extension of spring 502 while the extension of spring 502 has a net impact on the compression of spring 501. A net force applied to the tips of the probe depends on several factors including the spring constant of each spring, the net deflection of each spring, and any initial bias created in each spring. An upper probe tip is located at the upper end of tip arm 511 while the other end of the tip arm connects to a relatively rigid sliding frame structure via lateral crossbars 564-1 and 564-2 with these bars in turn connecting to the upper end of spring segment 501 as well as to other frame elements 561-1 to 561-4. Frame elements 561-1 to 561-4 at their lower ends connect to lateral cross bars 564-3 and 564-4 which are joined by the coupling and guide ring 562-5. The upper portion of spring 502 connects to slip ring 562-4 which also connects to tip arm 512 which ends in tip 512T. The sliding frame is held by and can slide longitudinally relative to a second frame that includes elements 563-1 to 563-3 with an interface between the frames being a plurality of slip rings 562-1 on the right and 562-2 on the left which are mounted to the second frame while slidingly engaging the first frame with a relative longitudinal positioning of the frames being a function of the relative position of upper and lower circuit elements (such as a DUT, device under test, or a space transformer or other test circuit interface elements that engage probe tips) along with any other movable or fixed stop to which the probe may engage. The framing elements help in stabilizing probe functionality and may help ensure that the compression spring 501 does not deflect or bow excessively. In some implementations, additional guide elements may be provided in front and/or behind both faces of one or both springs to provide additional operational stability. For example, initial biasing of one or both springs may be useful in providing different operational characteristics to the probe. For example, selecting and setting a minimum distance between element 563-3 and 564-4 that is greater than a nominal unbiased distance or setting a maximum distance between frame elements 563-3 and 564-2 may result in pre-biasing of the springs to provide an initial non-zero contact force for the probe.

Second Embodiment—Alternative 5: Probe with Various Stabilizing Guide Elements, and a Two-Segment Spring (One Tension and One Compression)

Figures 1, 6:
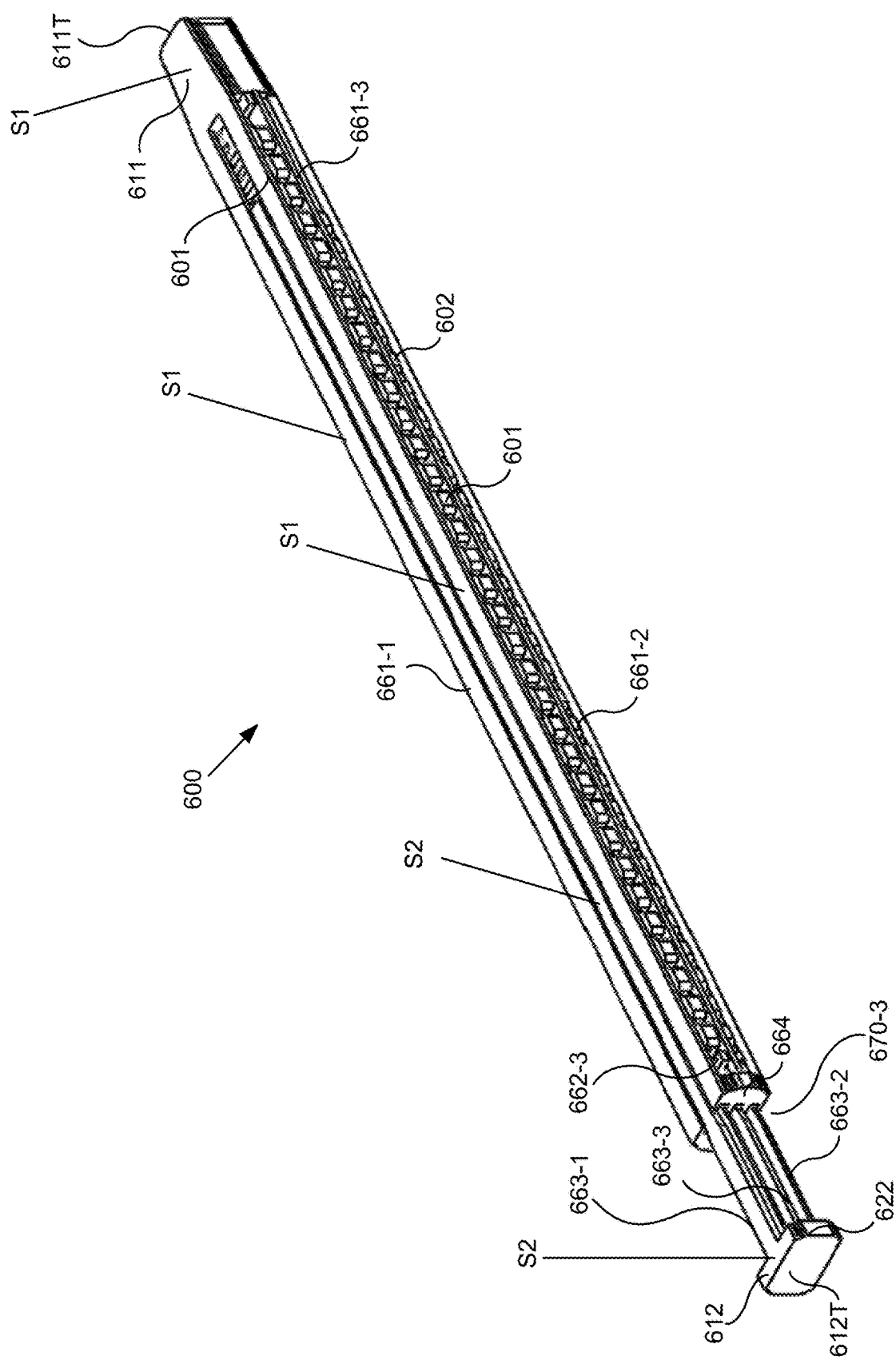
FIGS. 6-1 to 6-6 provide a number of isometric views of a probe and views of expanded sections of the probe according to another embodiment of the invention where the probe provides a specific implementation of spring and guide functionality of the probe of FIG. 5.

FIG. 6-1 provides an isometric view of a probe 600 according to another embodiment of the invention that provides functionality and structural relationships similar to those set forth in the probe of FIG. 5 wherein the probe includes first and second relatively movable structures S1 and S2 and compliant elements including two probe segments 601 and 602 connected in series. Structure S1 includes the first tip arm 611 and tip 611T (which may be used to make contact with a contact or bonding pad of a first electrical circuit element), guide arms 661-1 to 661-4 (with only 661-1 to 661-3 being visible) and end connector 664 that joins the guide arms while structure S2 includes guide arms 663-1 to 663-3 and movable stop 622 where S1 and S2 can slide relative to each other. S1 and S2 are connected by a spring assembly or group which includes a tensional portion or segment 602 that has a right end that joins the right end of S2 and a left end that joins the left end of a compressional spring segment 601 via a slidable connector 662-3, which can slide relative to the guide arms of both S1 and S2, which in turn, at a right end, joins S1. The left end of S2 is shown with a flat tip arm 612 and tip 612T. The tip 612T may be used to make electrical connection with a contact pad of a second electrical circuit element (e.g. a DUT or device under test, which may be an integrated circuit still in wafer form) and which, in alternative embodiments, may take on a variety of different forms other than the blunt flat tip configuration of the current example. As shown, flat tip arm 612 is separated from the right end of S1 to leave a gap 670-3 that allows compression of tip 612T toward tip 611T.

Figures 2, 6:
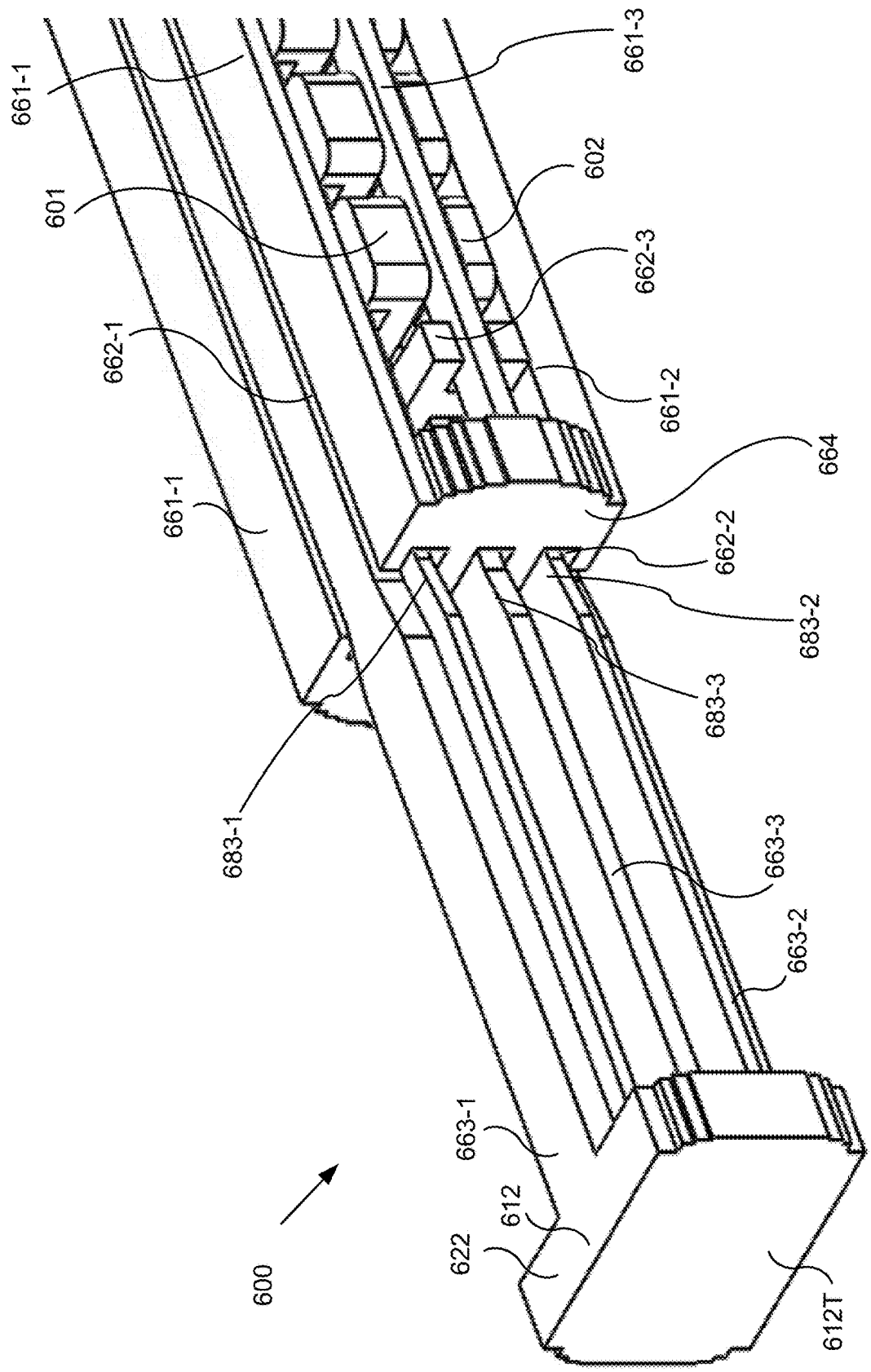

FIG. 6-2 provides a close up view of the left most portion of the probe of FIG. 6-1 so that various key elements can be better seen including: (1) Tip 612T; (2) Three guide arms 663-1, 663-2, and 663-3 of S2; (3) Main guide arms 661-1, 661-2, 661-3 of structure 1 (661-4 is out of view but corresponds to 661-3 on the opposite side of the probe); (4) Sliding interfaces or slots 662-1 and 662-2 for the T-shape rails or guides of S2, and the complementary shaped guides 661-1 and 661-2 formed by the guide arms of S1; and (5) Tensional segment 602 and the compressional segment 601, and the connector 662-3 that joins the two segments together and allows for sliding along both S1 and S2. Furthermore, in this example, guides 663-1, 663-2, and 663-3 can be seen having narrowed regions 683-1, 683-2, and 683-3, respectively, where the narrowed regions can be used to provide a larger gap between the guides and the openings in end 664 during fabrication of the assembled but not fully engaged probe (e.g. where formation occurs using a multi-layer electrochemical fabrication method), whereafter S1 and S2 are transitioned to a working or operational configuration by pressing the ends of the probe together wherein the wider regions of the guides are brought into the openings of 664, thereby narrowing the gap and providing a probe with a more stable operational configuration. For example, during formation, the gap is larger than a minimum feature size (e.g., a size that allows formation of the features to occur with desired or required yield, e.g., 80, 90, 95, or even 99%, or more, feature yield for a given fabrication process) which may be, for example, as large as 5, 10, 20, 30 microns or more. After transition to a work configuration, the gap is smaller than the minimum feature size, for example, and the gap may be reduced to 10, 5, 2 microns or even less. In other probe embodiments of the invention, such configuration size changes between interface regions for fabrication and use may be designed into other probe regions to improve stability and probe operation.

Figures 3, 6:
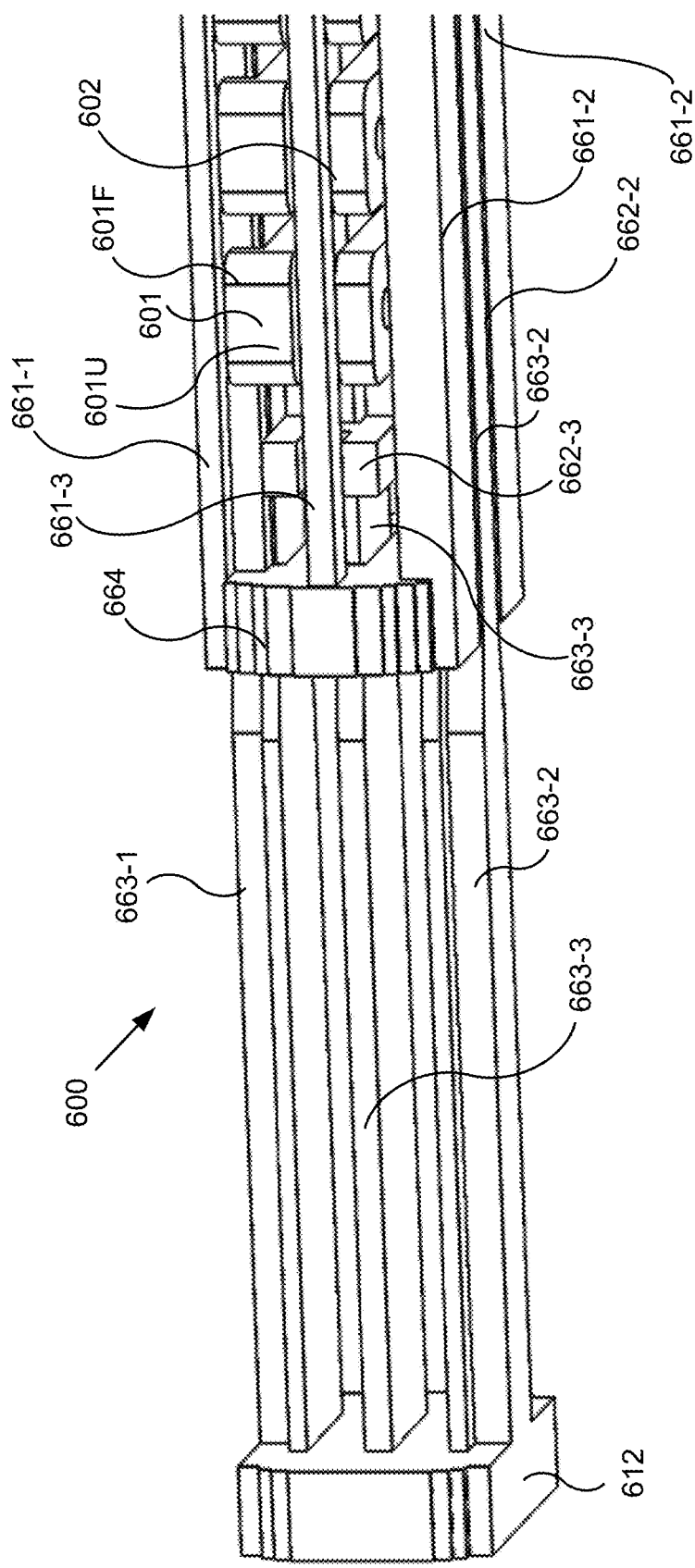
Figures 4, 6:
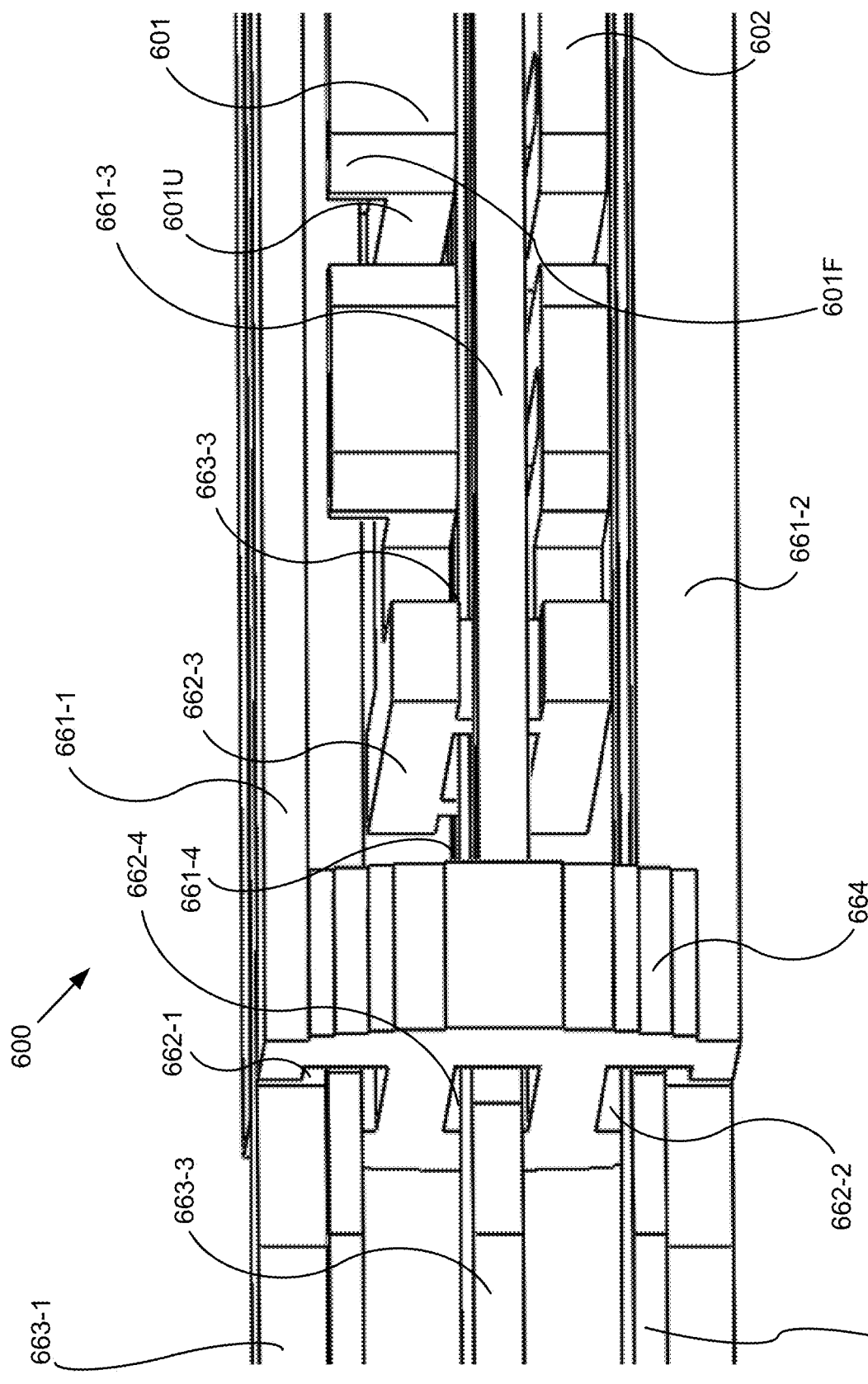
Figures 5, 6:
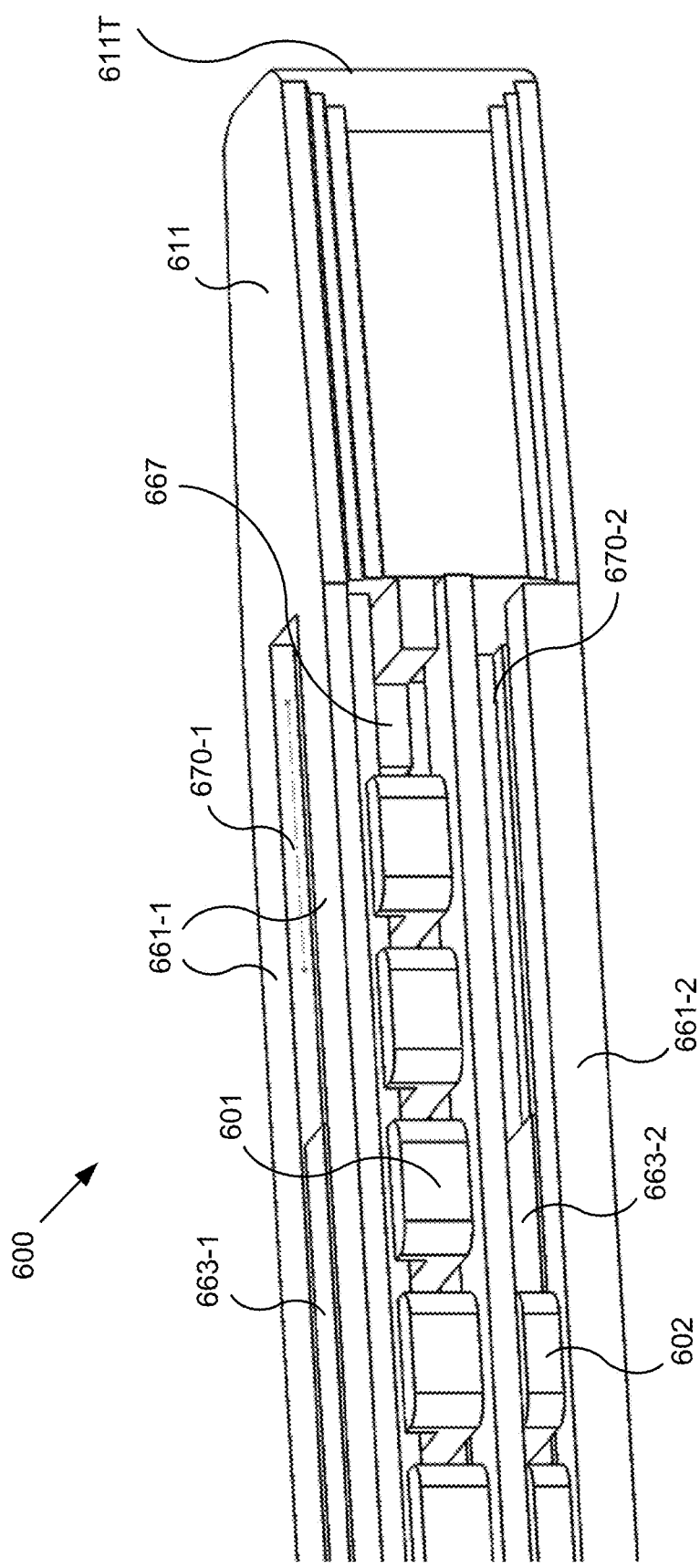
Figure 6:
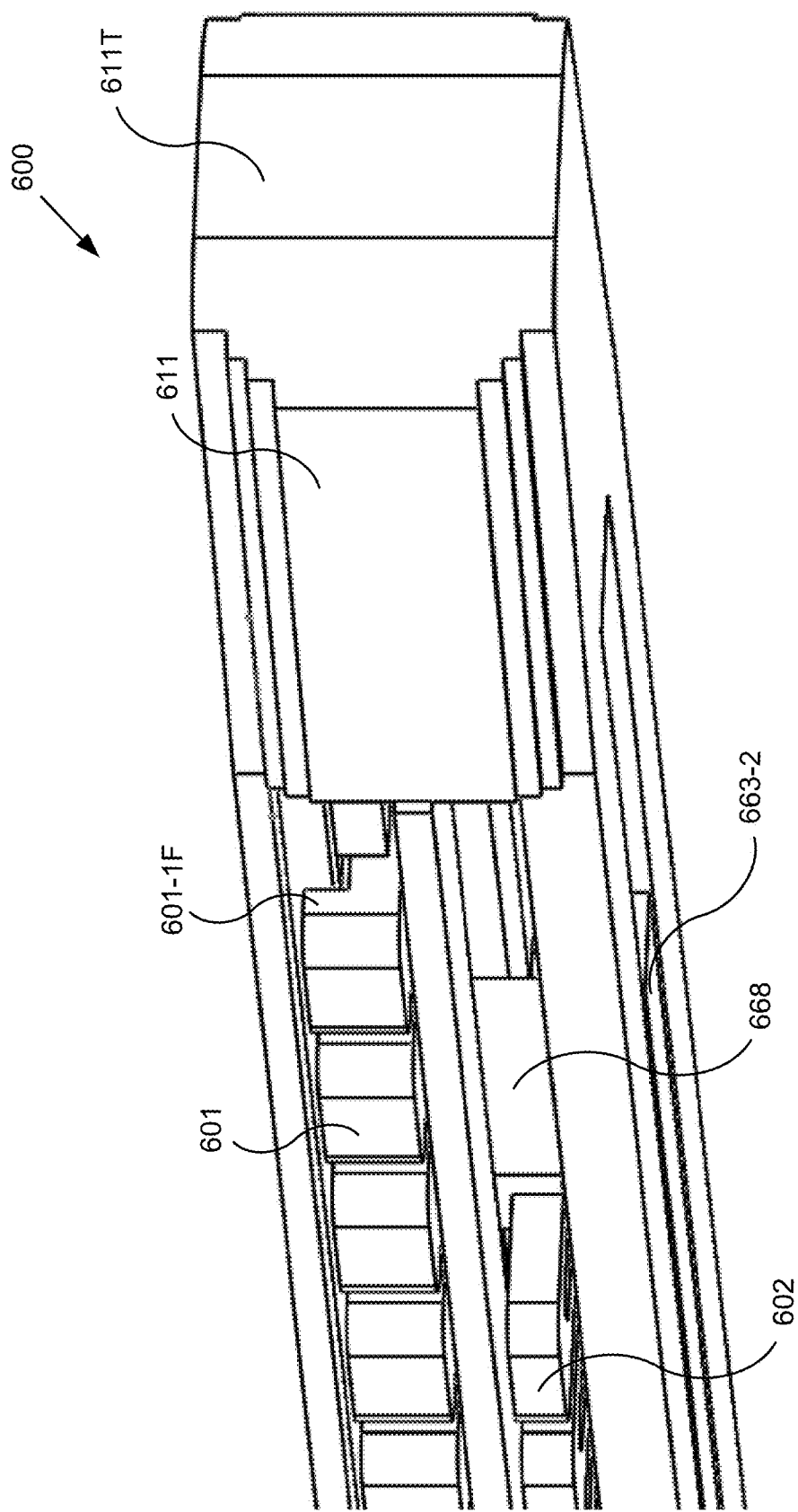

FIG. 6-3 provides an isometric view of the left end of S1 and S2 from a different angle compared to that of FIG. 6-2 so that additional features can be more readily seen such as the retention flanges 601F at the top of the undulations 601U of the compressive spring segment 601 which engages a slot along the bottom of guide arm 661-3 with similar flanges on the spring segment on the opposite side of the probe engaging a counterpart guide arm 661-4 on that side (see FIG. 6-4).

FIG. 6-4 provides a view of the left end of S1 from a different angle compared to that of FIG. 6-2 so that additional features may be more readily seen such as: (1) The double I configuration of the connector 662-3 that joins springs 601 and 602 while allowing the central bar 663-3 of S2 and side bars 661-3 and 661-4 of S1 to pass through it; and (2) Flanges 601F at the ends of undulations 601U (i.e. the elastically deformable compliant building blocks) of the compression spring segment 601.

FIG. 6-5 provides an isometric view of the right most ends of S1 and S2 so that select features may be more readily seen such as: (1) Attachment structure 667 joining the right end of the compression spring segment 601 to tip arm 611 of S1; and (2) Gaps 670-1 and 670-2 that provide space for elements 663-1 and 663-2 to move into during compression of the probe tips 611T and 612T toward one another.

FIG. 6-6 provides an isometric view of the right most ends of S1 and S2 from a different angle than that shown in FIG. 6-5 so that selected features may be more readily seen such as the attachment structure 668 that joins the right end of the tension spring 602 to the right end of the lower bar 663-2 and/or to the central bar 663-3 of S2.

Numerous variations of this embodiment are possible and include for example: (1) adding to the present embodiment features associated other embodiments or replacing some of the features of the present embodiment with those from one or more other embodiments, (2) using or including a different number of stabilizing guides, (3) using or including a different configuration of stabilizing guides, (4) using or including a different number of springs and with different configurations, including different numbers of segments and/or types of segments and our positional relationships between segments, and/or different connection relationships between segments and other segments or between segments and coupling structures, (5) using or including different tip configurations. (6) using or including different connecting elements that join the spring segments where the connecting elements may or may not provide guide features, (7) using or including fixed stop features, (8) using or including different or additional moving stop features, (9) using or including interface features that aid in aligning with and engaging fixed stop features that are part of array structures, (10) using or including interface features that aid in array loading and retention, and (11) using or including additional features for aiding in the pre-biasing of spring segments.

Third Embodiment: Probe with a Two-Segment Compression Spring

Figure 7:
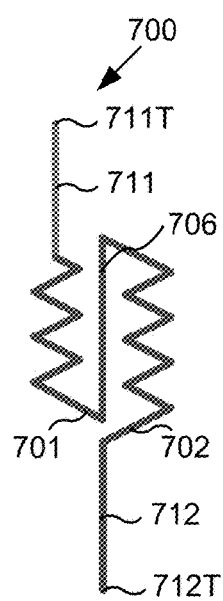
FIG. 7 provides a schematic representation of a probe according to another embodiment of the invention where the probe includes a spring with two segments with each operating in compression and connected to one another in series.

FIG. 7 provides a schematic representation of a probe 700 according to another embodiment of the invention where the probe includes a spring with two segments 701 and 702 with each being a compression spring connected in series. The probe also includes upper tip arm 711, upper tip 711T, lower tip arm 712, lower tip 712T, and longitudinal bridge 706 connecting the lower portion of spring segment 701 to the upper portion of spring segment 702. As with the other embodiments herein, like features are identified with like reference numbers from FIG.-to-FIG. and embodiment-to-embodiment with the exception that the series number for the reference is tied to the FIG. number.

Figures 8A, 8B:
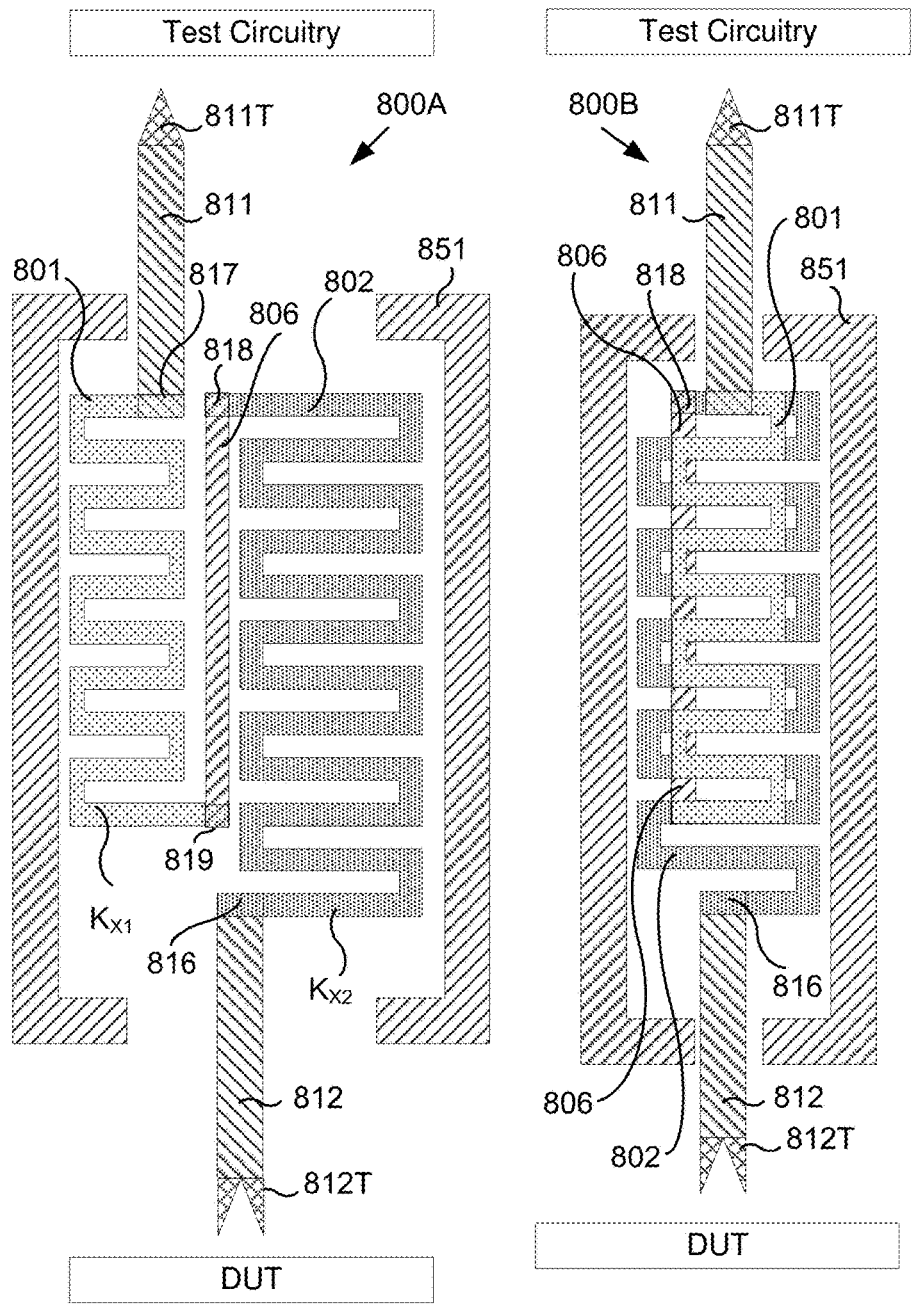
FIGS. 8A and 8B illustrate cut longitudinal cross-sectional views of two probes according to two additional embodiments of the invention where the probes have two compressional spring segments that operate in a sheath with the springs in the embodiment of FIG. 8A laying edge to edge with an intermediate connector arm operating in a space between the springs and possibly ensuring separation of the spring segments while in the embodiment of FIG. 8B, the spring segments operate face-to-face with the intermediate connector arm located between the faces.

Third Embodiment—Alternatives 2 & 3—Probes with a Two-Compression Spring Segments FIGS. 8A and 8B illustrate cut longitudinal cross-sectional views of probes 800A and 800B, respectively, where the probes have similar functionalities to the probe of FIG. 7. The two-segment spring 801 of FIG. 8A has its segments laying edge-to-edge with connection bar or longitudinal bridge 806 located between the segments while the spring segments of probe 800B of FIG. 8B are spaced face-to-face, side-by-side, or flat-surface-to-flat-surface with segment 801 located in front of segment 802 and with bridge 806 located between the two segments. Arm 812 connects to segment 802 at location 816, the other end of segment 802 connects to bridge 806 at location 818, the other end of bridge 806 connects to segment 801 at location 819, and the other end of segment 801 connects to arm 811 at location 817. The probe in each FIG. also includes a first or upper tip 811T connected to upper tip arm 811 and a lower tip 812T connected to lower tip arm 812 as well as a sheath 851 in which the arm and spring assembly can freely move longitudinally between any stops that may inhibit anything other than the arms and tips from extending beyond the upper and lower portions of the sheath. The probe segments are spaced from one another but may also be held within independent channels or otherwise shielded from interfering with one another by additional surfaces or other separating structures that minimize spring segment interference especially upon compression of the spring segments.

Figure 9:
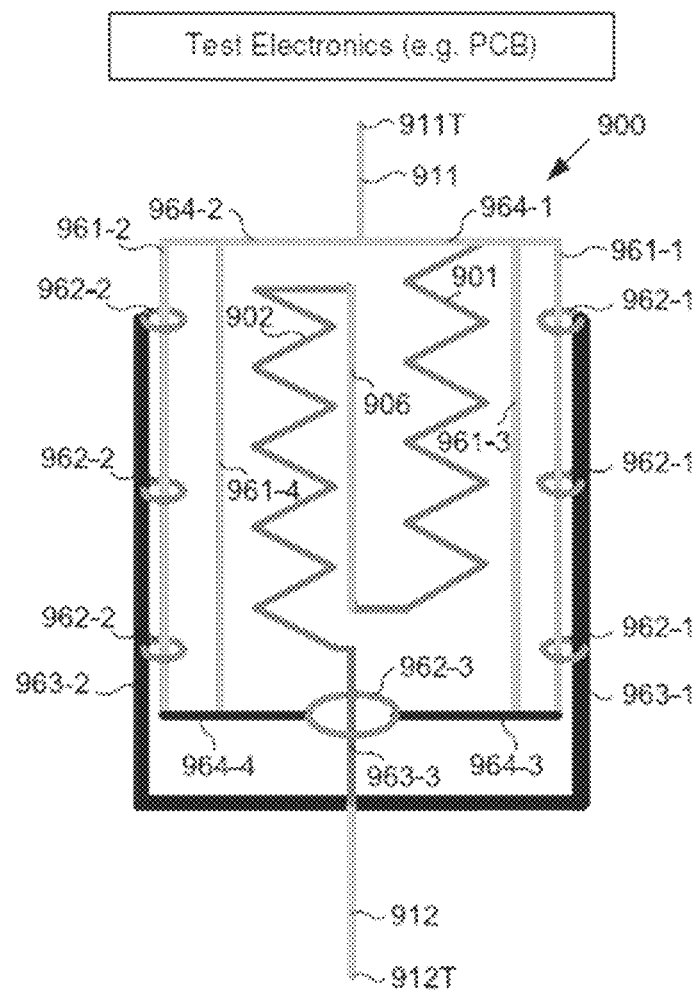
FIG. 9 provides a schematic representation of a probe according to another embodiment of the invention that uses framing and guidance structures similar to those of the embodiment of FIG. 5 but where the probe includes two spring segments with both operating in compression and wherein the lower end of the first spring rigidly engages a lower frame structure and a lower probe tip while the upper end of the second spring rigidly engages an upper frame structure and an upper probe tip and wherein the frame structures can move longitudinally relative to one another via a number of sliding guide structures.

Third Embodiment—Alternative 4: Probe with a Spring Having Two Compression Segments and Various Stabilizing Guide Elements FIG. 9 provides a schematic view of a probe 900 which is similar to probe 500 of FIG. 5 with the exception that instead of the probe including both a compression spring and an extension spring, the probe of FIG. 9 includes two compression spring segments 901 and 902 that functionally connected in series via a connecting bar 906. The other reference numbers in FIG. 9 address the same features as do the corresponding numbers in FIG. 5 (ignoring the series number of each).

Figures 1, 10:
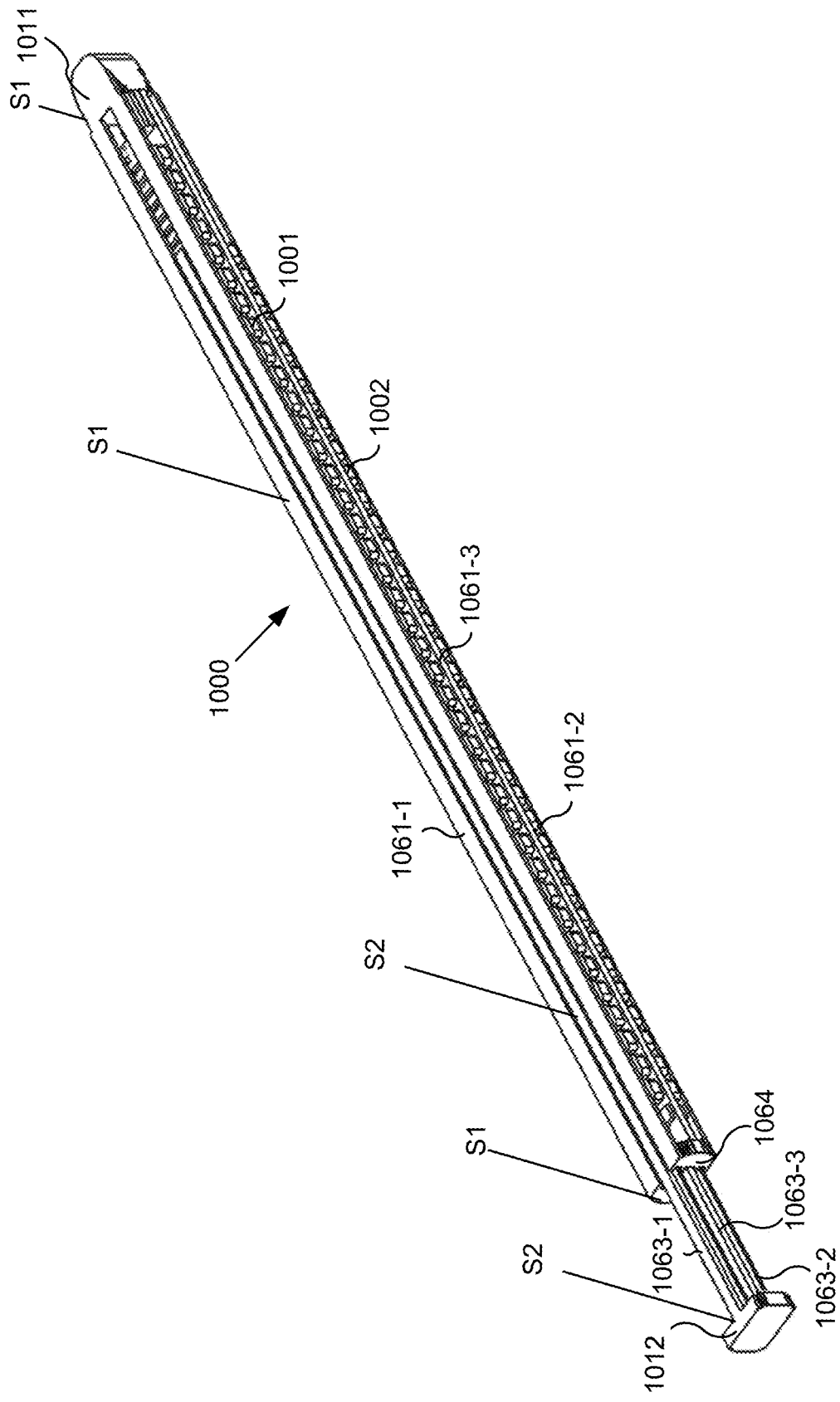
Figures 2, 10:
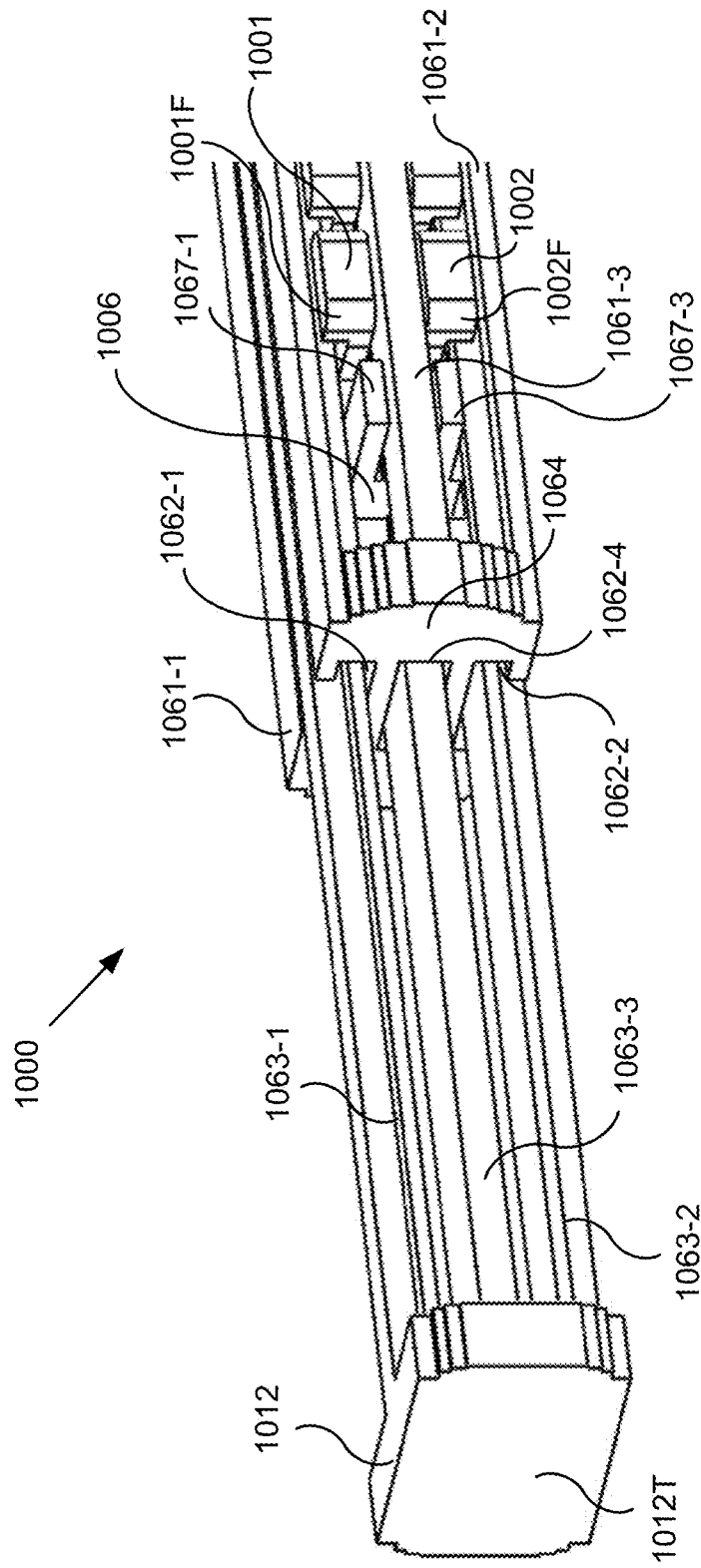
Figures 3, 10:
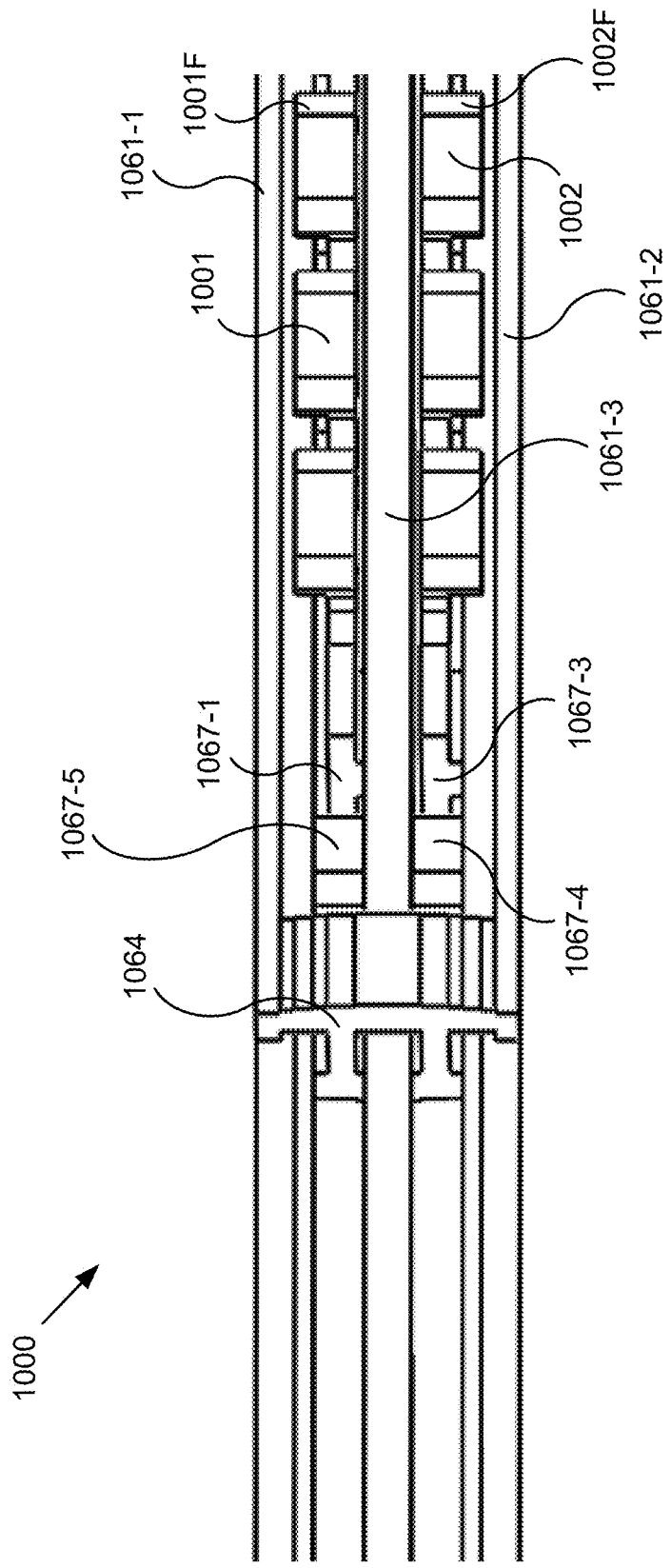
Figures 4, 10:
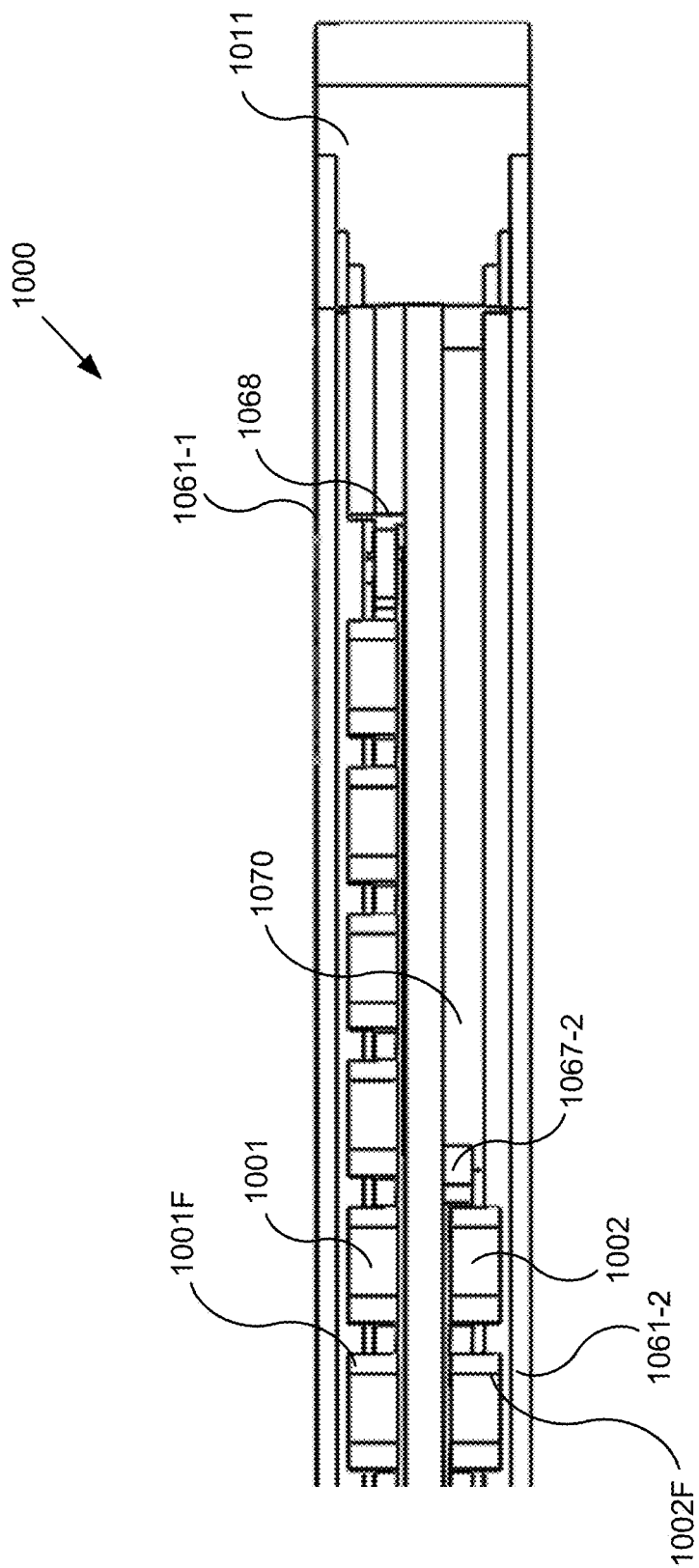

Third Embodiment—Alternative 5: Probe with Various Stabilizing Guide Elements and Two Compression Spring Segments FIG. 10-1 provides an isometric view of an example probe 1000 operating according to the schematic illustration shown in FIG. 9. Similar features in FIG. 9 and FIGS. 10-1 to 10-4 are identified with similar reference numerals with the exception of the change from references being in the 900 series in FIG. 9 and being the 1000 series in FIGS. 10-1 to 10-4. Similar features and reference numbering also exist between FIGS. 6-1 to 6-6 and FIGS. 10-1 to 10-4. The probe includes first structure S1 and second structure S2 that can longitudinally move relative to one another with the upper spring segment 1001 rigidly connected to S1 (which includes sliding guides 1061-1 to 1061-3 and tip arm 1011) and segment 1002 rigidly connected to S2 (which includes guide arms 1063-1 to 1063-3 and tip arm 1012) and with the opposing ends of the two spring segments (right end of 1002 and left end of 1001) being rigidly connected to one another by a longitudinally extending connector bar 1006 (see FIG. 10-2) such that the structures and the springs engage one another to provide spring loaded longitudinal movement of probe ends while limiting excessive non-longitudinal movement of the spring segments.

FIG. 10-2 provides an isometric view of the left most portion of S1 and S2 so that various elements can be better seen:

(1) Three guide arms 1063-1, 1063-2, and 1063-3 of S2, (2) Three main guide arms 1061-1, 1061-2, 1061-3 of S3 (the fourth guide arm opposite 1061-3 is not visible), (3) Sliding interfaces 1062-1 and 1062-2 formed by the T-shape guides 1063-1 and 1063-2 of S2 and the complementary faces of guides 1061-1 and 1061-2 of S1, (4) Lower compressional spring segment 1002, (5) Upper compressional spring segment 1001, (6) Connector 1067-1 that joins the upper segment 1001 to bar 1006 (with 1006 extending from the left end of spring segment 1001 to the right end of spring segment 1002 via connection element 1067-2 (see FIG. 10-4) that allows for sliding of the opposing ends of the spring segments (right end of segment 1001 and left end of segment 1002) along both S1 and S2, (7) Connector 1067-3 that connects the left end of spring segment 1002 to guide bar 1063-2 of S2, and (8) Slide 1064 that is affixed to S1 but retains and allows movement of S2 structures via interfaces 1062-1 that allows movement of 1063-1, 1062-2 that allows movement of 1063-2, and 1062-4 that allows movement of 1063-3, and (9) Flanges 1001F at the top of the upper spring 1001 and flanges 1002F at the bottom of the lower spring portion 1002 that ensure that the segments do move out of their intended compressive tracks along guides 1061-1 and 1061-2.

FIG. 10-3 provides an isometric view of the left end of S1 and S2 from a different angle compared to that of FIG. 10-2 so that additional features can be more readily seen:

(1) Connection element 1064 that connects upper guide rail 1061-1, center guide rail 1061-3, and lower guide rails 1061-2 of S1 to one another, (2) Connection element 1067-3 that connects the left end of spring segment 1002 to guide 1063-2 of S2, (3) Connection elements 1067-4 and 1067-5 which connect 1063-2 to 1063-3 and 1063-3 to 1063-1, respectively, and (4) Retention flanges 1001F at the top of the compliant elements of upper spring segment 1001 and retention flanges 1002F at the bottom of the compliant elements of the lower spring segment 1002 and how the flanges engage and can slide along the stems of main guide arms 1061-1 and 1061-2 (with similar flanges on the spring segments on the opposite side of the probe engaging the guide arms on that side—not visible).

FIG. 10-4 provides an isometric view of the right ends of S1 and S2 so that certain features may be more readily seen:

(1) Connection structure 1067-2 that joins bar 1006 to the right end of the compression spring segment 1002 with bar 1006 extending longitudinally to the left end of spring segment 1001 where it is joined to spring segment 1001, (2) Connection structure 1068 which joins the at right end of spring segment to S1 via tip arm 1011, (3) The sliding engagement of the compliant elements of spring segment 1001 to upper guide 1061-1 via flanges 1001F, (4) The sliding engagement of the compliant elements of spring segment 1002 to lower guide 1061-2 via flanges 1002F, and (5) Gap 1070 to the right of connection structure 1067-2 to allow compressive movement of spring segments and S2 elements relative to S1 elements.

Still other embodiments may be created by combining the various embodiments and their alternatives which have been set forth herein with other embodiments and their alternatives which have been set forth herein.

Further Comments and Conclusions

Various other embodiments of the present invention exist. Some of these embodiments may be based on a combination of the teachings herein with various teachings incorporated herein by reference. For example, some fabrication embodiments may not use any blanket deposition process. Some embodiments may use selective deposition processes or blanket deposition processes on some layers that are not electrodeposition processes. Some embodiments may use nickel or nickel-cobalt as a structural material while other embodiments may use different materials. For example, preferred spring materials include nickel (Ni), copper (Cu) in combination with one or more other materials, beryllium copper (BeCu), nickel phosphorous (Ni—P), tungsten (W), aluminum copper (Al—Cu), steel, P7 alloy, palladium, palladium-cobalt, silver, molybdenum, manganese, brass, chrome, chromium copper (Cr—Cu), and combinations of these. Some embodiments may use copper as the structural material with or without a sacrificial material.

Structural or sacrificial dielectric materials may be incorporated into embodiments of the present invention in a variety of different ways. Such materials may form a third material or higher deposited material on selected layers or may form one of the first two materials deposited on some layers. Additional teachings concerning the formation of structures on dielectric substrates and/or the formation of structures that incorporate dielectric materials into the formation process and possibility into the final structures as formed are set forth in a number of patent applications filed Dec. 31, 2003: (1) U.S. Patent Application No. 60/534,184, which is entitled "Electrochemical Fabrication Methods Incorporating Dielectric Materials and/or Using Dielectric Substrates"; (2) U.S. Patent Application No. 60/533,932, which is entitled "Electrochemical Fabrication Methods Using Dielectric Substrates"; (3) U.S. Patent Application No. 60/534,157, which is entitled "Electrochemical Fabrication Methods Incorporating Dielectric Materials"; (4) U.S. Patent Application No. 60/533,891, which is entitled "Methods for Electrochemically Fabricating Structures Incorporating Dielectric Sheets and/or Seed layers That Are Partially Removed Via Planarization"; and (5) U.S. Patent Application No. 60/533,895, which is entitled "Electrochemical Fabrication Method for Producing Multi-layer Three-Dimensional Structures on a Porous Dielectric". These patent filings are each hereby incorporated herein by reference as if set forth in full herein.

Additional patent filings that provide, intra alia, teachings concerning incorporation of dielectrics into electrochemical fabrication processes include: (1) U.S. patent application Ser. No. 11/139,262, filed May 26, 2005, now U.S. Pat. No. 7,501,328, by Lockard, et al., and which is entitled "Methods for Electrochemically Fabricating Structures Using Adhered Masks, Incorporating Dielectric Sheets, and/or Seed Layers that are Partially Removed Via Planarization"; (2) U.S. patent application Ser. No. 11/029,216, filed Jan. 3, 2005 by Cohen, et al., now abandoned, and which is entitled "Electrochemical Fabrication Methods Incorporating Dielectric Materials and/or Using Dielectric Substrates"; (3) U.S. patent application Ser. No. 11/028,957, by Cohen, which was filed on Jan. 3, 2005, now abandoned, and which is entitled "Incorporating Dielectric Materials and/or Using Dielectric Substrates"; (4) U.S. patent application Ser. No. 10/841,300, by Lockard et al., which was filed on May 7, 2004, now abandoned, and which is entitled "Methods for Electrochemically Fabricating Structures Using Adhered Masks, Incorporating Dielectric Sheets, and/or Seed Layers that are Partially Removed Via Planarization"; (5) U.S. patent application Ser. No. 10/841,378, by Lembrikov et al., which was filed on May 7, 2004, now U.S. Pat. No. 7,527,721, and which is entitled "Electrochemical Fabrication Method for Producing Multi-layer Three-Dimensional Structures on a Porous Dielectric"; (6) U.S. patent application Ser. No. 11/325,405, filed Jan. 3, 2006 by Dennis R. Smalley, now abandoned, and which is entitled "Method of Forming Electrically Isolated Structures Using Thin Dielectric Coatings"; (7) U.S. patent application Ser. No. 10/607,931, by Brown, et al., which was filed on Jun. 27, 2003, now U.S. Pat. No. 7,239,219, and which is entitled "Miniature RF and Microwave Components and Methods for Fabricating Such Components", (8) U.S. patent application Ser. No. 10/841,006, by Thompson, et al., which was filed on May 7, 2004, now abandoned, and which is entitled "Electrochemically Fabricated Structures Having Dielectric or Active Bases and Methods of and Apparatus for Producing Such Structures"; (9) U.S. patent application Ser. No. 10/434,295, by Cohen, which was filed on May 7, 2003, now abandoned, and which is entitled "Method of and Apparatus for Forming Three-Dimensional Structures Integral With Semiconductor Based Circuitry"; and (10) U.S. patent application Ser. No. 10/677,556, by Cohen, et al., filed Oct. 1, 2003, now abandoned, and which is entitled "Monolithic Structures Including Alignment and/or Retention Fixtures for Accepting Components". These patent filings are each hereby incorporated herein by reference as if set forth in full herein.

Some embodiments may employ diffusion bonding or the like to enhance adhesion between successive layers of material or to reduce stress. Various teachings concerning the use of diffusion bonding in electrochemical fabrication processes are set forth in U.S. patent application Ser. No. 10/841,384, which was filed May 7, 2004 by Cohen et al., now abandoned, which is entitled "Method of Electrochemically Fabricating Multilayer Structures Having Improved Interlayer Adhesion" and which is hereby incorporated herein by reference as if set forth in full.

The patent applications and patents set forth below are hereby incorporated by reference herein as if set forth in full. The teachings in these incorporated applications can be combined with the teachings of the instant application in many ways: For example, enhanced methods of producing structures may be derived from some combinations of teachings, enhanced structures may be obtainable, enhanced apparatus may be derived, enhanced methods of using may be implemented, and the like.

| U.S. patent application No., Filing Date U.S. application Pub. No., Pub. Date U.S. Pat. No., Pub. Date | First Named Inventor, Title |
|---|---|
| 10/271,574 - Oct. 15, 2002 2003-0127336 - July 10, 2003 7,288,178 - Oct. 30, 2007 | Cohen, "Methods of and Apparatus for Making High Aspect Ratio Microelectromechanical Structures" |
| 10/387,958 - Mar. 13, 2003 2003-022168 - Dec. 4, 2003 — | Cohen, "Electrochemical Fabrication Method and Application for Producing Three-Dimensional Structures Having Improved Surface Finish" |
| 10/434,289 - May 7, 2003 2004-0065555 - Apr. 8, 2004 — | Zhang, "Conformable Contact Masking Methods and Apparatus Utilizing In Situ Cathodic Activation of a Substrate" |
| 10/434,294 - May 7, 2003 2004-0065550 - Apr. 8, 2004 — | Zhang, "Electrochemical Fabrication Methods With Enhanced Post Deposition Processing" |
| 10/434,315 - May 7, 2003 2003-0234179 - Dec. 25, 2003 7,229,542 - Jun. 12, 2007 | Bang, "Methods of and Apparatus for Molding Structures Using Sacrificial Metal Patterns" |
| 10/434,494 - May 7, 2003 2004-0000489 - Jan. 1, 2004 — | Zhang, "Methods and Apparatus for Monitoring Deposition Quality During Conformable Contact Mask Plating Operations" |
| 10/677,498 - Oct. 1, 2003 2004-0134788 - Jul. 15, 2004 7,235,166 - Jun. 26, 2007 | Cohen, "Multi-cell Masks and Methods and Apparatus for Using Such Masks To Form Three-Dimensional Structures" |
| 10/697,597 - Dec. 20, 2002 2004-0146650 - Jul. 29, 2004 | Lockard, "EFAB Methods and Apparatus Including Spray Metal or Powder Coating Processes" |
| 10/724,513 - Nov. 26, 2003 2004-0147124 - Jul. 29, 2004 7,368,044 - May 6, 2008 | Cohen, "Non-Conformable Masks and Methods and Apparatus for Forming Three-Dimensional Structures" |
| 10/724,515 - Nov. 26, 2003 2004-0182716 - Sep. 23, 2004 7,291,254 - Nov. 6, 2007 | Cohen, "Method for Electrochemically Forming Structures Including Non-Parallel Mating of Contact Masks and Substrates" |
| 10/830,262 - Apr. 21, 2004 2004-0251142 - Dec. 16, 2004 7,198,704 - Apr. 3, 2007 | Cohen, "Methods of Reducing Interlayer Discontinuities in Electrochemically Fabricated Three-Dimensional Structures" |
| 10/841,100 - May 7, 2004 2005-0032362 - Feb. 10, 2005 7,109,118 - Sep. 19, 2006 | Cohen, "Electrochemical Fabrication Methods Including Use of Surface Treatments to Reduce Overplating and/or Planarization During Formation of Multi-layer Three-Dimensional Structures" |

-continued

| U.S. patent application No., Filing Date U.S. application Pub. No., Pub. Date U.S. Pat. No., Pub. Date | First Named Inventor, Title |
|---|---|
| 10/841,347 - May 7, 2004 2005-0072681 - Apr. 7, 2005 — | Cohen, "Multi-step Release Method for Electrochemically Fabricated Structures" |
| 10/949,744 - Sep. 24, 2004 2005-0126916 - Jun. 16, 2005 7,498,714 - Mar. 3, 2009 | Lockard, "Multi-Layer Three-Dimensional Structures Having Features Smaller Than a Minimum Feature Size Associated with the Formation of Individual Layers" |
| 12/345,624 - Dec. 29, 2008 — 8,070,931 - Dec. 6, 2011 | Cohen, "Electrochemical Fabrication Method Including Elastic Joining of Structures" |
| 14/194,564 - Feb. 28, 2014 2014-0238865 - Aug. 28, 2014 9,540,233 - Jan. 10, 2017 | Kumar, "Methods of Forming Three-Dimensional Structures Having Reduced Stress and/or Curvature" |
| 14/720,719 - May 22, 2015 — 9,878,401 - Jan. 30, 2018 | Veeramani, "Methods of Forming Parts Using Laser Machining" |
| 14/872,033 - Sep. 30, 2015 — — | Le, "Multi-Layer, Multi-Material Microscale and Millimeter Scale Batch Part Fabrication Methods Including Disambiguation of Good Parts and Defective Parts" |

Various other embodiments of the present invention exist. Some of these embodiments may be based on a combination of the teachings herein with various teachings incorporated herein by reference. Some method of making embodiments may not use any blanket deposition process and/or they may not use a planarization process. Some embodiments may use selective deposition processes or blanket deposition processes on some layers that are not electrodeposition processes. Some embodiments, for example, may use nickel, nickel-phosphorous, nickel-cobalt, palladium, palladium-cobalt, gold, copper, tin, silver, zinc, solder, rhodium, rhenium as structural materials while other embodiments may use different materials. Some embodiments, for example, may use copper, tin, zinc, solder or other materials as sacrificial materials. Some embodiments may use different structural materials on different layers or on different portions of single layers. Some embodiments may remove a sacrificial material while other embodiments may not. Some embodiments may use photoresist, polyimide, glass, ceramics, other polymers, and the like as dielectric structural materials.

It will be understood by those of skill in the art that additional operations may be used in variations of the above presented method of making embodiments. These additional operations may, for example, perform cleaning functions (e.g., between the primary operations discussed herein or discussed in the various materials incorporated herein by reference), and they may perform activation functions and monitoring functions, and the like.

It will also be understood that the probe elements of some aspects of the invention may be formed with processes which are very different from the processes set forth herein, and it is not intended that structural aspects of the invention need to be formed by only those processes taught herein or by processes made obvious by those taught herein.

Though various portions of this specification have been provided with headers, it is not intended that the headers be used to limit the application of teachings found in one portion of the specification from applying to other portions of the specification. For example, alternatives acknowledged in association with one embodiment are intended to apply to all embodiments to the extent that the features of the different embodiments make such applications functional and do not otherwise contradict or remove all benefits of the adopted embodiment. Various other embodiments of the present invention exist. Some of these embodiments may be based on a combination of the teachings set forth herein with various teachings incorporated herein by reference.

It is intended that any aspects of the invention set forth herein represent independent invention descriptions which Applicant contemplates as full and complete invention descriptions that Applicant believes may be set forth as independent claims without need of importing additional limitations or elements, from other embodiments or aspects set forth herein, for interpretation or clarification other than when explicitly set forth in such independent claims once written. It is also understood that any variations of the aspects set forth herein represent individual and separate features that may form separate independent claims, be individually added to independent claims, or added as dependent claims to further define an invention being claimed by those respective dependent claims should they be written.

In view of the teachings herein, many further embodiments, alternatives in design and uses of the embodiments of the instant invention will be apparent to those of skill in the art. As such, it is not intended that the invention be limited to the particular illustrative embodiments, alternatives, and uses described above but instead that it be solely limited by the claims presented hereafter.

I claim:

1. A probe comprising:
   (a) a sheath;
   (b) a plurality of flat spring segments having edges and faces, located in parallel with their faces facing each other and connected directly, without an intervening element, or indirectly, with an intervening element;
   (c) at least one contact tip arm connected directly or indirectly to at least one of the plurality of flat spring segments and with another end of the contact arm connected directly or indirectly to a first contact tip; and (d) at least one second tip arm connected directly or indirectly to another of the plurality of flat spring segments and with another end of the second tip arm connected to a second tip with a configuration selected from the group consisting of: (1) a contact tip, and (2) an attachment tip, wherein the first tip and the second tip are different tips, wherein the sheath at least partially encases at least one of the plurality of flat spring segments, wherein at least one flat spring segment is a compressive spring segment and undergoes compression when probe tips are pressed toward one another, wherein the at least one flat spring segment that undergoes compression is inhibited from excessive deflection in a direction perpendicular to a face of the at least one flat spring segment, when unbiased, by a fixed portion of the sheath, wherein the at least one flat spring segment that undergoes compression is also inhibited from excessive deflection in a direction that is perpendicular to the face and to a longitudinal axis of the at least one flat spring segment, wherein a second of the plurality of flat spring segments is selected from the group consisting of: (1) a compressional spring segment, and (2) a tensional spring segment, and wherein the plurality of flat spring segments are connected directly or indirectly together in a manner selected from the group consisting of: (1) in series, (2) in parallel, and (3) a combination of serial and parallel connections, wherein at least two of the flat spring segments are connected in series, wherein the at least one flat spring segment that undergoes compression has a width and thickness that is captured at least around its edges and a portion of its front and back faces by elements defining a compressive movement slot that inhibits excessive non-longitudinal movement of the compressive segment, wherein the second of the flat spring segments is a tensional spring segment that undergoes extension when the probe tips are pressed toward one another, and wherein the probe additionally comprising a sheath having a compressive slot with a compressive width for compressive movement of the segment that undergoes compression while the sheath also has a tensional slot with a tensional width for tensional movement of the tensional spring segment, wherein the compressive width is larger than the tensional width and wherein the tensional width is smaller than the compressive width of the spring segment that undergoes compression.

2. The probe of claim 1, wherein the plurality of spring segments have configurations selected from the group consisting of: (1) a serpentine pattern, (2) a repeated pattern with C-shaped elements, (3) a repeated pattern with S-shaped elements, (4) a repeated pattern with pattern angled elements where the angles are under 90°, (5) a repeated pattern with saw-tooth shaped elements, (6) a repeated pattern with angled elements where the angles are 90°, and (7) a repeated pattern with sine-shaped elements.

3. The probe of claim 2, further comprising:
a sheath having a plurality of slots, each slot separated by a fixed barrier structure wherein the at least one compressive spring segment that undergoes compression moves within a compressive slot while at least one of the other spring segments moves within a different slot.

4. A probe comprising:
(a) a sheath;
(b) a plurality of flat spring segments having edges and faces, located in parallel with their faces facing each other and connected directly, without an intervening element, or indirectly, with an intervening element;
(c) at least one contact tip arm connected directly or indirectly to at least one of the plurality of flat spring segments and with another end of the contact arm connected directly or indirectly to a first contact tip; and
(d) at least one second tip arm connected directly or indirectly to another of the plurality of flat spring segments and with another end of the second tip arm connected to a second tip with a configuration selected from the group consisting of: (1) a contact tip, and (2) an attachment tip, wherein the first tip and the second tip are different tips, wherein the sheath at least partially encases at least one of the plurality of flat spring segments, wherein at least one flat spring segment is a compressive spring segment and undergoes compression when probe tips are pressed toward one another, wherein the at least one flat spring segment that undergoes compression is inhibited from excessive deflection in a direction perpendicular to a face of the at least one flat spring segment, when unbiased, by a fixed portion of the sheath, wherein the at least one flat spring segment that undergoes compression is also inhibited from excessive deflection in a direction that is perpendicular to the face and to a longitudinal axis of the at least one flat spring segment, wherein a second of the plurality of flat spring segments is selected from the group consisting of: (1) a compressional spring segment, and (2) a tensional spring segment, and wherein the plurality of flat spring segments are connected directly or indirectly together in a manner selected from the group consisting of: (1) in series, (2) in parallel, and (3) a combination of serial and parallel connections, wherein at least two of the flat spring segments are connected in series, wherein the at least one flat spring segment that undergoes compression has a width and thickness that is captured at least around its edges and a portion of its front and back faces by elements defining a compressive movement slot that inhibits excessive non-longitudinal movement of the compressive segment, wherein the second of the flat spring segments is a tensional spring segment that undergoes extension when the probe tips are pressed toward one another, and wherein the sheath has a compressive slot with a compressive width for compressive movement of the spring segment that undergoes compression while the sheath also has a tensional slot with a tensional width for tensional movement of the tensional segment, wherein the compressive slot is shifted from the tensional slot such that the compressive slot and the tensional slot only partially overlap in a direction perpendicular to faces of the flat spring segments.

5. The probe of claim 4, wherein the plurality of spring segments have configurations selected from the group consisting of: (1) a serpentine pattern, (2) a repeated pattern with C-shaped elements, (3) a repeated pattern with S-shaped elements, (4) a repeated pattern with pattern angled elements where the angles are under 90°, (5) a repeated pattern with saw-tooth shaped elements, (6) a repeated pattern with angled elements where the angles are 90°, and (7) a repeated pattern with sine-shaped elements.

6. The probe of claim 4, further comprising:
a sheath having a plurality of slots, each slot separated by a fixed barrier structure wherein the at least one compressive spring segment that undergoes compression moves within a compressive slot while at least one of the other spring segments moves within a different slot.

7. A probe comprising:
(a) a sheath;
(b) a plurality of flat spring segments having edges and faces, located in parallel with their faces facing each other and connected directly, without an intervening element, or indirectly, with an intervening element;
(c) at least one contact tip arm connected directly or indirectly to at least one of the plurality of flat spring segments and with another end of the contact arm connected directly or indirectly to a first contact tip; and
(d) at least one second tip arm connected directly or indirectly to another of the plurality of flat spring segments and with another end of the second tip arm connected to a second tip with a configuration selected from the group consisting of: (1) a contact tip, and (2) an attachment tip,
wherein the first tip and the second tip are different tips,
wherein the sheath at least partially encases at least one of the plurality of flat spring segments,
wherein at least one flat spring segment is a compressive spring segment and undergoes compression when probe tips are pressed toward one another,
wherein the at least one flat spring segment that undergoes compression is inhibited from excessive deflection in a direction perpendicular to a face of the at least one flat spring segment, when unbiased, by a fixed portion of the sheath,
wherein the at least one flat spring segment that undergoes compression is also inhibited from excessive deflection in a direction that is perpendicular to the face and to a longitudinal axis of the at least one flat spring segment,
wherein a second of the plurality of flat spring segments is selected from the group consisting of: (1) a compressional spring segment, and (2) a tensional spring segment, and wherein the plurality of flat spring segments are connected directly or indirectly together in a manner selected from the group consisting of: (1) in series, (2) in parallel, and (3) a combination of serial and parallel connections,
wherein at least two of the flat spring segments are connected in series,
wherein the plurality of spring segments have configurations selected from the group consisting of: (1) a serpentine pattern, (2) a repeated pattern with C-shaped elements, (3) a repeated pattern with S-shaped elements, (4) a repeated pattern with pattern angled elements where the angles are under 90°, (5) a repeated pattern with saw-tooth shaped elements, (6) a repeated pattern with angled elements where the angles are 90°, and (7) a repeated pattern with sine-shaped elements, and
wherein the probe additionally comprising a sheath having a plurality of slots, each slot separated by a fixed barrier structure wherein the at least one compressive spring segment that undergoes compression moves within a compressive slot while at least one of the other spring segments moves within a different slot.

8. A probe for testing a DUT, comprising:
(a) a first tip for making electrical contact to an electrical circuit element, the first tip having a contact region and an attachment region;
(b) a first extension arm connecting directly or indirectly to the attachment region of the first tip;
(c) a compliant structure comprising at least one spring segment, wherein a first region of the compliant structure joins the first extension arm;
(d) a second extension arm joining a second region of the compliant structure such that relative displacement of the first and second extension arms results in elastic movement of the at least one spring segment of the compliant structure;
(e) a second tip having a first attachment region and a second region wherein the first attachment region of the second tip joins the second extension arm; and
(f) a guidance structure that limits elastic movement of the compliant structure to substantially longitudinal movement along a longitudinal axis of the probe,
wherein the at least one spring segment operates under compression to provide an elastic restoration force,
wherein the second region of the second tip is configured for making an electrical connection to a second circuit element, wherein the configuration is selected from the group consisting of: (1) a tip for making a contact connection, and (2) a tip for making an attached connection, and
wherein the probe is configured to have a first guide path for movement of a compression segment having a configuration selected from the group consisting of: (1) the first guide path is wider than a neighboring guide path for an adjacent spring segment; (2) the first guide path overlaps but is offset from a neighboring guide path for an adjacent spring segment; (3) the first guide path is bounded by a barrier material that at least partially separates the first guide path from a neighboring guide path such that the barrier material allows for separation of the spring segments in neighboring paths while providing a smooth or low friction surface against which the compression segment can slide; (4) the first guide path provides a rail on which the compression spring can move with at least one of the compression springs or the rail providing at least a partial side wall, lip, or plurality of extended features that inhibit the compression spring from moving an excessive amount laterally, wherein an amount that could cause current to flow in an unintended path, an amount that could cause binding of the segment or could otherwise hinder smooth operation of the spring either during forced compression or during elastic return to a less biased state.

9. The probe of claim 8, wherein the at least one spring segment comprises at least two spring segments that are joined together in a serial configuration.

10. The probe of claim 9, wherein the at least two joined spring segments operate in compression.

11. The probe of claim 8, wherein the at least one spring segment comprises at least two flat spring segments wherein the two flat spring segments are spaced from one another but at least partially overlay one another in a face-to-face configuration.

12. The probe of claim 11, wherein the two flat spring segments are separated from one another by an intermediate surface against which at least one of the segments can slide.

13. The probe of claim 12, wherein the guidance structure forms at least part of a sheath through which the compliant structure moves.

* * * * *